(12) United States Patent
Sato et al.

(10) Patent No.: US 9,893,736 B2
(45) Date of Patent: Feb. 13, 2018

(54) ANALOG TO DIGITAL CONVERSION DEVICE, ILLUMINANCE SENSOR DEVICE, AND ELECTRONIC APPARATUS COMPRISING THE ILLUMINANCE SENSOR DEVICE

(71) Applicant: SHARP KABUSHIKI KAISHA, Osaka-shi, Osaka (JP)

(72) Inventors: Hideki Sato, Osaka (JP); Takahiro Inoue, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 667 days.

(21) Appl. No.: 14/389,922

(22) PCT Filed: Mar. 28, 2013

(86) PCT No.: PCT/JP2013/059330
§ 371 (c)(1),
(2) Date: Oct. 1, 2014

(87) PCT Pub. No.: WO2013/153962
PCT Pub. Date: Oct. 17, 2013

(65) Prior Publication Data
US 2015/0077320 A1    Mar. 19, 2015

(30) Foreign Application Priority Data

Apr. 9, 2012 (JP) .................................. 2012-088568

(51) Int. Cl.
| | |
|---|---|
| G09G 3/36 | (2006.01) |
| H03M 1/06 | (2006.01) |
| G01J 1/44 | (2006.01) |
| G01J 3/51 | (2006.01) |
| G01J 1/46 | (2006.01) |
| G09G 3/34 | (2006.01) |
| G02F 1/133 | (2006.01) |
| H03M 1/12 | (2006.01) |
| G02F 1/1335 | (2006.01) |

(52) U.S. Cl.
CPC ................. H03M 1/06 (2013.01); G01J 1/44 (2013.01); G01J 1/46 (2013.01); G01J 3/513 (2013.01);
(Continued)

(58) Field of Classification Search
CPC ........ H03M 1/06; H03M 1/12; H03M 1/0634; H03M 1/123; G02F 1/13318;
(Continued)

(56) References Cited

U.S. PATENT DOCUMENTS 7,164,378 B2 *  1/2007  Oprescu ................ H03M 3/322
                                              341/143
8,203,473 B2 *  6/2012  Ono .................... H03M 1/0607
                                              341/118

(Continued)

FOREIGN PATENT DOCUMENTS

CN    101061636 A    10/2007
CN    101065792 A    10/2007

(Continued)

Primary Examiner — Kent Chang
Assistant Examiner — Andrew Lee
(74) Attorney, Agent, or Firm — Birch, Stewart, Kolasch & Birch, LLP

(57) ABSTRACT

An analog to digital conversion device has a plurality of, two, for example, analog to digital converters, and a reference charge quantity interchange section arranged and configured to interchange, among the plurality of analog to digital converters, reference quantities of electric charge (e.g., reference currents or reference capacitances) to be used therein during an analog to digital conversion period.

33 Claims, 13 Drawing Sheets

(52) U.S. Cl.
CPC ....... *G02F 1/13318* (2013.01); *G09G 3/3406* (2013.01); *H03M 1/0634* (2013.01); *H03M 1/12* (2013.01); *G01J 2001/444* (2013.01); *G01J 2001/446* (2013.01); *G02F 1/1336* (2013.01); *G09G 2320/0626* (2013.01); *G09G 2360/145* (2013.01); *H03M 1/123* (2013.01)

(58) Field of Classification Search
CPC ...... G02F 1/1336; G09G 3/3406; G01J 3/513; G01J 1/46; G01J 1/44; G01J 2001/444; G01J 2001/446
See application file for complete search history.

(56) References Cited

U.S. PATENT DOCUMENTS

| | | | |
|---|---|---|---|
| 8,208,055 B2* | 6/2012 | Hiyama | H03M 1/06 348/222.1 |
| 2008/0012741 A1* | 1/2008 | Nakata | H03M 1/14 341/155 |
| 2008/0272710 A1 | 11/2008 | Abe et al. | |
| 2010/0245141 A1* | 9/2010 | Ushie | H03M 1/1076 341/122 |

FOREIGN PATENT DOCUMENTS

| | | |
|---|---|---|
| JP | 2007-073591 A | 3/2007 |
| JP | 2010-153484 A | 7/2010 |
| WO | WO 2006/044992 A2 | 4/2006 |

\* cited by examiner

ANALOG TO DIGITAL CONVERSION DEVICE, ILLUMINANCE SENSOR DEVICE, AND ELECTRONIC APPARATUS COMPRISING THE ILLUMINANCE SENSOR DEVICE

TECHNICAL FIELD

The present invention relates to an analog to digital conversion device, an illuminance sensor device, and electronic apparatus having the illuminance sensor device.

BACKGROUND ART

There has been a need for mounting an illuminance sensor device for a liquid crystal panel of devices such as digital cameras and mobile phones, in order to control the amount of light emitted from a backlight device of the liquid crystal according to the illuminance of disturbance light. Analog type illuminance sensor devices were used before, but nowadays digital-type illuminance sensors are common because high resolution is required. Further, the illumination sensor devices are required to have spectral characteristics close to visual sensitivity. Thus, for the illuminance sensor devices having an analog to digital converter that converts an input current from photodiodes, there is a demand for realizing spectral characteristics close to the visual sensitivity with simple configuration.

In conventional illuminance sensor devices, in order to realize the spectral characteristics close to the visual sensitivity, a scheme of subtracting between currents of a plurality of photodiodes having different spectral characteristics is generally adopted.

As such a scheme of subtracting between currents of a plurality of photodiodes, JP 2007-73591 (PTL 1) teaches that subtraction between the currents from the photodiodes having different spectral characteristics is performed using a current mirror circuit to thereby obtain spectral characteristics close to the visual sensitivity.

Also, as a scheme of subtracting between the currents from the photodiodes and obtaining different spectral characteristics through color filters, JP 2010-153484 (PTL 2) discloses that subtraction between currents from photodiodes having the different spectral characteristics is performed by a current mirror circuit and in addition color filters are used, whereby spectral characteristics close to the visual sensitivity are obtained.

In a sensing method generally adopted in the illuminance sensor devices, a sensor output is converted to a digital value by an analog to digital converter. Conversion of the sensor output to a digital value facilitates the processing by software in CPUs and microcomputers. Integral type analog to digital converters are capable of realizing a highly accurate resolution with a simple structure. The integral type analog to digital converters are suitable for devices which are required to have a slow but high resolution (16 bits or so), such as illuminance sensors.

As a first conventional example, FIG. 13 shows a subtractive type structure using a current mirror circuit as in JP 2007-73591 (PTL 1) and JP 2010-153484 (PTL 2). In FIG. 13, PD1 indicates a photodiode having spectral characteristics of the infrared region, PD2 indicates a photodiode having spectral characteristics of from the visible to the infrared region, and Q1 and Q2 indicate transistors constituting a current mirror circuit.

In FIG. 13 showing the first conventional example, input current from the photodiode PD1 having the spectral characteristics of the infrared region is represented as Iin1, and input current from the photodiode PD2 having the spectral characteristics of from the visible to the infrared region is represented as Iin2. In the first conventional example, a current corresponding to an amount of the input current Iin1 is subtracted from the input current Iin2 to calculate an amount of current (Iin2−Iin1×a) to thereby obtain spectral characteristics close to visual sensitivity characteristics.

FIG. 14 shows, as a second conventional example a configuration in which a sensor output is converted to a digital value by analog to digital converters ADC1, ADC2 and then subtraction between the digital values is performed. In FIG. 14 showing the second conventional example, input current from the photodiode PD1 having the spectral characteristics of the infrared region is represented as Iin1, and input current from the photodiode PD2 having the spectral characteristics of from the visible to the infrared region is represented as Iin2.

In the second conventional example, with a result of analog to digital conversion of the input current Iin2 by the analog to digital converter ADC1 being a digital value ADCCUNT2 and with a result of analog to digital conversion of the input current Iin1 by the analog to digital converter ADC2 being a digital value ADCOUNT1, the digital value ADCOUNT1 multiplied by a is subtracted from the digital value ADCOUNT2, so that the same result as in the first conventional example is obtained through the digital operations, as shown below.

$$ADCOUNT2 - ADCOUNT1 \times a = Iin2 - Iin1 \times a$$

FIG. 15 shows, as a third conventional example, a configuration in which analog to digital conversion is performed using one analog to digital converter ADC1 upon each of the input current Iin1 from the photodiode PD1 having the spectral characteristics of the infrared region and the input current Iin2 from the photodiode PD2 having the spectral characteristics of from the visible to the infrared region, followed by the subtraction between digital values obtained by the conversion. In the configuration of FIG. 15, unlike the second conventional example, the input currents Iin1 and Iin2 are not measured or determined at the same time, and their analog to digital conversions are performed at different times, i.e., in different conversion periods. Switching the input of the analog to digital converter ADC1 between the input current Iin1 and the input current Iin2 every conversion period allows the one analog to digital converter ADC1 to obtain the AD operation results.

CITATION LIST

Patent Literature

PTL 1: JP 2007-73591
PTL 2: JP 2010-153484

SUMMARY OF THE INVENTION

Technical Problem

The first conventional example has a problem that due to errors by the current mirror circuit, correct subtraction results may not be obtained.

In the second conventional example, if there is an error in characteristics between the two analog to digital converters ADC1 and ADC2, an error in the digital subtraction operation result may be large relative to the error in characteristics between the two analog to digital converters ADC1 and ADC2.

For example, in the case of a=1, ADCOUNT1=80, and ADCOUNT2=100, the digital operation result of (ADCOUNT2−ADCOUNT1×a) should be 20. If, however, there occurs an error in characteristics between the two analog to digital converters ADC1 and ADC2 so that a 10% smaller value is actually output as a count value of ADCOUNT2, i.e., ADCOUNT2=90, the digital operation result of (ADCOUNT2−ADCOUNT1×a) will be 10, which is 50% smaller than when there is no error in characteristics.

In the second conventional example, influence of the error in characteristics upon the digital operation result is noticeable especially when the light source has a lot of infrared components, because in such a case values of the first term and the second term of (ADCOUNT2−ADCOUNT1×a) are close to each other. Thus, highly accurate measurement results may not be obtained.

In addition, in the configuration of the second conventional example, even when a plurality of analog to digital converters are used, error in characteristics between the analog to digital converters will cause error in the final result of the digital operations.

In the third conventional example, there is no such error in characteristics between analog to digital converters, unlike the second conventional example. However, because the input current Iin1 and the input current Iin2 are not measured at the same time, there may occur an error relative to the change of the illuminance with time.

Therefore, an object of the present invention is to provide an analog to digital conversion device that can reduce the error between a plurality of analog to digital converters.

A second object of the present invention is to provide an illuminance sensor device that can perform illuminance measurement or detection with high accuracy by using the analog to digital conversion device.

A third object of the present invention is to provide electronic apparatus that can control the luminance of backlight with high accuracy using the illuminance sensor device.

Solution to Problem

An analog to digital conversion device according to an aspect of the present invention includes:
a plurality of analog to digital converters; and
a reference charge quantity interchange section arranged and configured to interchange among the plurality of analog to digital converters reference quantities of electric charge to be used therein during an analog to digital conversion period.

With the above arrangement, in the analog to digital conversion period, the reference quantities of electric charge to be used in the respective analog to digital converters are interchanged between the converters by the reference charge quantity interchange section. By equally providing periods for interchange of the reference quantities of electric charge, even if there is a difference or differences between or among the reference quantities of electric charge in each period, the reference quantities of electric charge to be used in the analog to digital converters during the analog to digital conversion period can be equalized between or among the converters. This can eliminate error in characteristics due to difference in reference quantity of electric charge between or among the analog to digital converters. In addition, because the analog to digital converters make simultaneous determinations or measurements, there will be no error relative to the change of time.

In one embodiment, the analog to digital converters may consist of n analog to digital converters, where n is an integer of two or more. The analog to digital conversion device may include a reference current source to supply each of the n analog to digital converters with n reference currents used as the reference quantities of electric charge, wherein the reference charge quantity interchange section interchanges the reference currents among the n analog to digital converters every one-nth (1/n) of the analog to digital conversion period such that each of the n analog to digital converters uses the n reference currents by time-division scheme.

In this embodiment, the reference currents to be used in the respective analog to digital converters are interchanged among these analog to digital converters every one-nth (1/n) of the analog to digital conversion period by the reference charge quantity interchange section so that each of the n analog to digital converters uses the n reference currents by time-division scheme during the analog to digital conversion period. Therefore, even if there is a difference or differences between or among the reference currents, the reference currents to be used in the analog to digital converters during the analog to digital conversion period can be equalized between or among the converters, resulting in that error in characteristics due to difference in reference current among the analog to digital converters can be eliminated.

In one embodiment, the analog to digital converters may consist of n analog to digital converters, where n is an integer of two or more. The analog to digital conversion device may include n reference capacitors providing each of the n analog to digital converters with reference capacitances used as the reference quantities of electric charge, wherein the reference charge quantity interchange section interchanges the reference capacitors among the n analog to digital converters every one-nth (1/n) of the analog to digital conversion period such that each of the n analog to digital converters uses the reference capacitances of the n reference capacitors by time-division scheme.

In this embodiment, the reference capacitors to be used in the respective analog to digital converters are interchanged among these analog to digital converters every one-nth (1/n) of the analog to digital conversion period by the reference charge quantity interchange section so that each of the n analog to digital converters uses the capacitances of the n reference capacitors by time-division scheme during the analog to digital conversion period. Therefore, even if there is a difference or differences between or among the capacitances of the reference capacitors, the capacitances of the reference capacitors to be used in the analog to digital converters during the analog to digital conversion period can be equalized between or among the converters, resulting in that error in characteristics due to difference in reference capacitor among the analog to digital converters can be eliminated.

In one embodiment, each analog to digital converter may include:
a charge circuit having a capacitor for storing electric charge corresponding to an input current to the analog to digital converter;
a discharge circuit configured to discharge the electric charge stored in the capacitor of the charge circuit;
a reference voltage source configured to supply a reference voltage;

a comparator configured to compare an output voltage output from the charge circuit with the reference voltage output from the reference voltage source;

a switch configured to connect an output of the reference voltage source to an output of the charge circuit to charge the output of the charge circuit up to the reference voltage; and a control circuit controlling the discharge circuit, the control circuit being configured to count a number of dischargings by the discharge circuit, based on outputs of the comparator, and output a digital value corresponding to the number of dischargings.

In the embodiment, the analog to digital converters are of integral type. Thus, the reference quantities of electric charge to be used in the respective analog to digital converters are interchanged among these analog to digital converters every one-nth (1/n) of the analog to digital conversion period so that each of the n analog to digital converters uses the n reference quantities of electric charge currents in turn in each one-nth (1/n) of the analog to digital conversion period. In this way, highly accurate analog to digital conversion can be performed.

An illuminance sensor device according to an aspect of the invention includes:

any one of the above-described analog to digital conversion devices;

a first photodiode having spectral characteristics of an infrared region; and a second photodiode having spectral characteristics of from a visible to an infrared region, wherein the analog to digital conversion device has two analog to digital converters, one of which is supplied with an input current from the first photodiode and the other of which is supplied with an input current from the second photodiode.

With the above arrangement, a digital value resulting from the analog to digital conversion by the one analog to digital converter of the input current from the first photodiode having the spectral characteristics of the infrared region is subtracted from a digital value resulting from the analog to digital conversion by the other analog to digital converter of the input current from the second photodiode having the spectral characteristics of from the visible to the infrared regions. As a result, it is possible to obtain spectral characteristics close to the visual sensitivity characteristics which allows illuminance measurements with high accuracy.

An illuminance sensor device according to an aspect of the invention includes:

any one of the above-described analog to digital conversion devices;

a first photodiode provided with a filter transmitting light in a red region;

a second photodiode provided with a filter transmitting light in a green region;

a third photodiode provided with a filter transmitting light in a blue region; and a fourth photodiode having spectral characteristics of from a visible to an infrared region, the analog to digital conversion device having four analog to digital converters, which are first to fourth analog to digital converters, wherein the first analog to digital converter is supplied with an input current from the first photodiode, the second analog to digital converter is supplied with an input current from the second photodiode, the third analog to digital converter being supplied with an input current from the third photodiode, and the fourth analog to digital converter being supplied with an input current from the fourth photodiode.

With the above arrangement, the first analog to digital converter performs analog to digital conversion upon the input current from the first photodiode having the filter transmitting light in the red region. The second analog to digital converter performs analog to digital conversion upon the input current from the second photodiode having the filter transmitting light in the green region. The first analog to digital converter performs analog to digital conversion upon the input current from the third photodiode having the filter transmitting light in the blue region. The fourth analog to digital converter performs analog to digital conversion upon the input current from the fourth photodiode having the spectral characteristics of from the visible region to the infrared region. Based on the digital values resulting from these conversions, spectral characteristics close to the visual sensitivity characteristics can be obtained, resulting in achievement of highly accurate measurement of illuminance.

Electronic apparatus according to an aspect of the present invention includes:

a liquid crystal panel configured to display a screen;

a backlight device configured to illuminate the liquid crystal panel;

a backlight control unit configured to control luminance of light of the backlight device; and any one of the above-described illuminance sensor devices, the backlight control unit controlling the luminance of light of the backlight device based on digital signals output from the analog to digital converters of the illuminance sensor device.

With the arrangement, because the illuminance sensor device, which is capable of determining illuminance with high accuracy, is used, it is possible to control the luminance of backlight.

Advantageous Effects of Invention

As is apparent from the above, the present invention can provide an analog to digital conversion device that can reduce the error between a plurality of analog to digital converters.

Also, the present invention can provide an illuminance sensor device that can perform illuminance measurement or detection with high accuracy.

Furthermore, the present invention provide electronic apparatus that can control the luminance of backlight with high accuracy.

DETAILED DESCRIPTION OF THE INVENTION

Embodiments of the analog to digital conversion device, the illuminance sensor device, and the electronic apparatus having the illuminance sensor device of the present invention will be described in detail below referring to the attached figures.

First Embodiment

Figure 1:
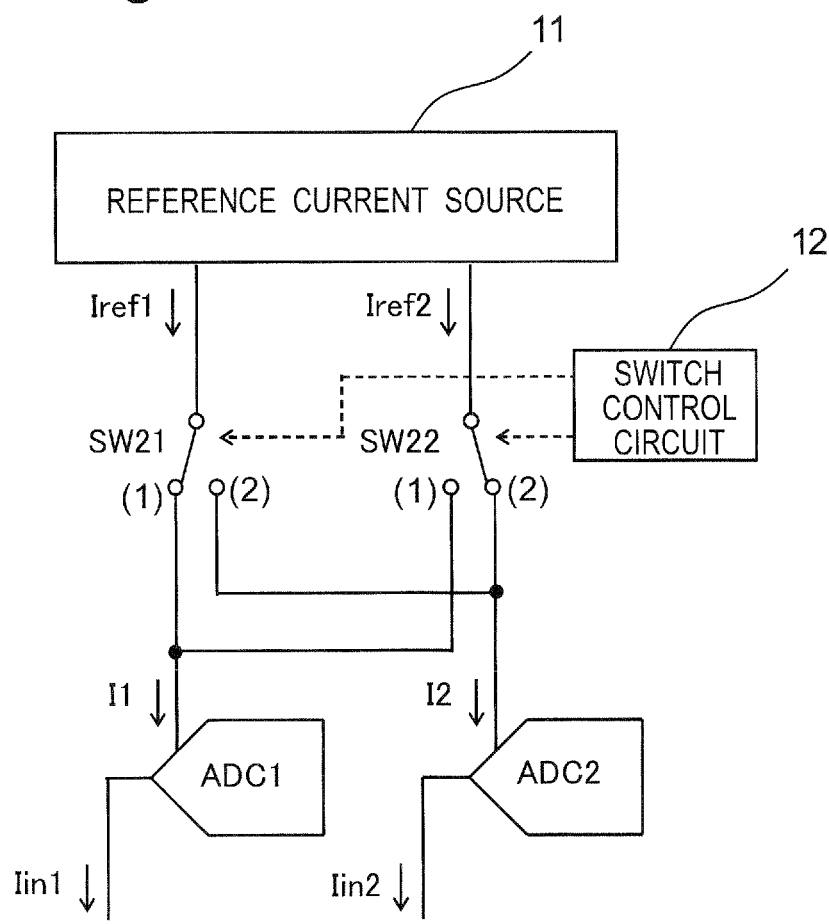
FIG. 1 shows a diagram illustrating a configuration of an analog to digital conversion device according to a first embodiment of the present invention.

FIG. 1 shows a diagram illustrating a configuration of an analog to digital conversion device according to a first embodiment of the present invention.

As shown in FIG. 1, the analog to digital conversion device of the first embodiment has two analog to digital converters ADC1, ADC2, a reference current source 11 to generate two reference currents Iref1, Iref2, switch SW21 for switching the reference current Iref1 from the current source 11 between the two analog to digital converters, a switch SW22 for switching the reference current Iref2 from the reference current source 11 between the two analog to digital converters, and a switch control circuit 12 for controlling the switches SW21, SW22.

The switches SW21, SW22 and the switch control circuit 12 constitute a reference charge quantity interchange section.

The analog to digital conversion device has a function of interchanging the reference currents between the analog to digital converters ADC1, ADC2 during the analog to digital conversion period. That is, each of the two analog to digital converters ADC1, ADC2 uses both of the two reference currents Iref1, Iref2 by time-division scheme.

In the analog to digital conversion device, positions or states of each of the switches SW21, SW22 are changed during the analog to digital conversion period by the switch control circuit 12 in the following manner.

In a first period, i.e., a first half of the analog to digital conversion period, the switch SW21 is switched to position (1), while the switch SW22 is switched to position (2) so that Iref1 is used as a reference current I1 for use in the first analog to digital converter ADC1 and Iref2 is used as a reference current I2 for use in the second analog to digital converter ADC2.

Next, in a second period, i.e., a second half of the analog to digital conversion period, the switch SW21 is switched to position (2), while the switch SW22 is switched to position (1) so that Iref2 is used as the reference current I1 for use in the first analog to digital converter ADC1 and Iref1 is used as the reference current I2 for use in the second analog to digital converter ADC2.

Such switching can reduce error in characteristics between the two analog to digital converters ADC1, ADC2 even if there is a difference between values of the reference currents Iref1 and Iref2.

In the analog to digital conversion device, in the case of equally providing the first and second periods in one analog to digital conversion period, that is, in the case of interchanging the reference currents to be used in the two analog to digital converters ADC1, ADC2 every half of the analog to digital conversion period so that the reference currents Iref1 and Iref2 are alternately used every half of the analog to digital conversion periods, the amounts of the reference currents used in the two analog to digital converters can be equalized between the two analog to digital converters, resulting in that error in characteristics due to difference in reference current between the analog to digital converters can be eliminated.

When using a plurality of analog to digital converters (i.e., n analog to digital converters) and a plurality of reference currents (i.e., n reference currents) as well, the reference currents to be used in the n analog to digital converters may be interchanged among the n analog to digital converters every one-nth (1/n) of the analog to digital conversion period so that each analog to digital converter uses the n reference currents in turn in each one-nth of the analog to digital conversion period. Thus, it is apparent that in this case as well, the amounts of the reference currents used in each analog to digital converter can be equalized among these analog to digital converters, resulting in that error in characteristics due to difference in reference current among the analog to digital converters can be eliminated.

Figure 2:
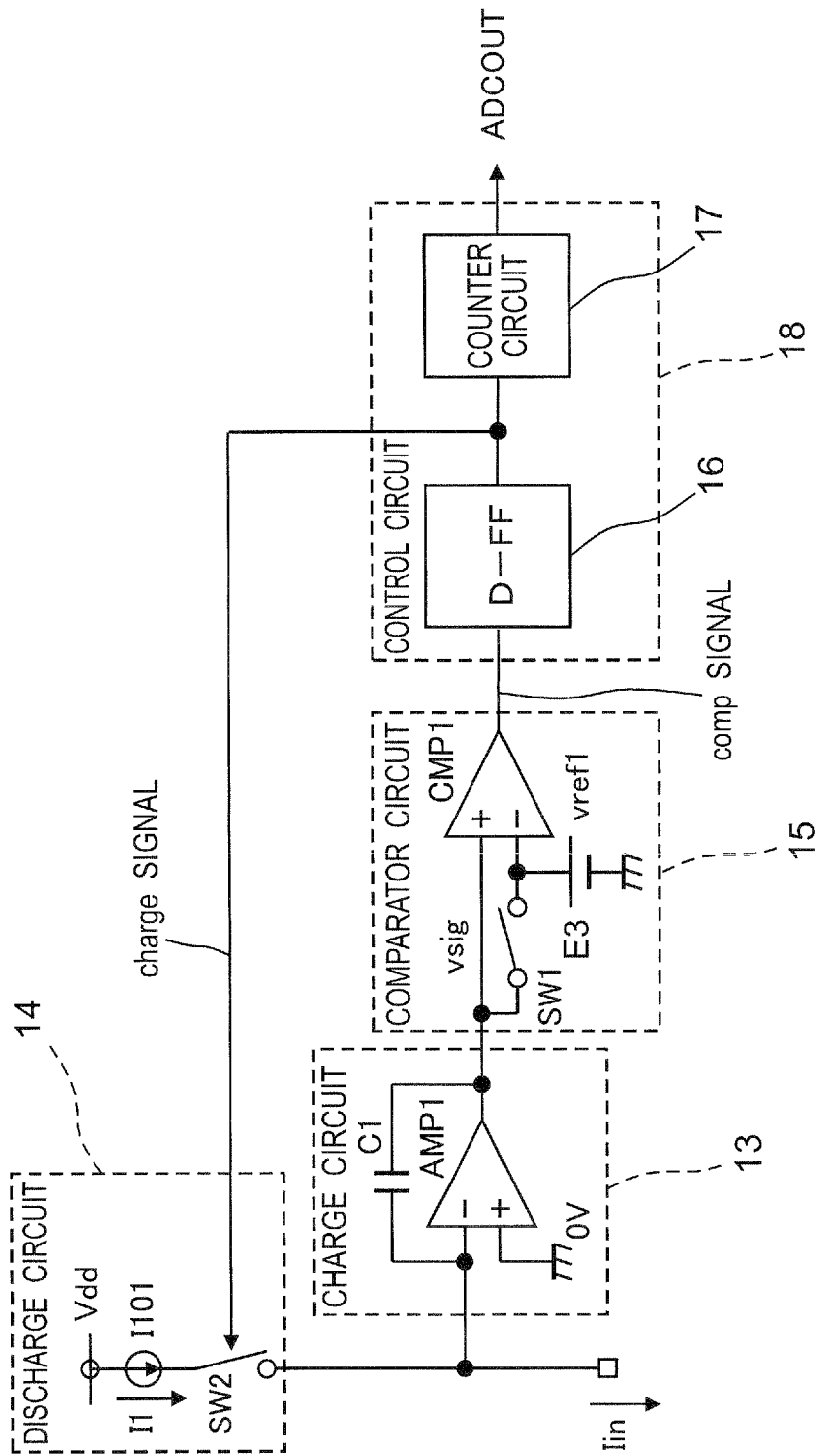
FIG. 2 shows a diagram illustrating a configuration of an example of the integral type analog to digital converter to be used in the analog to digital conversion device.

FIG. 2 illustrates a configuration of an integral type analog to digital converter to be used in the analog to digital conversion device by way of example.

This analog to digital converter is a circuit that converts an amount of input current Iin to a digital value and outputs the digital value. As shown in FIG. 2, the analog to digital converter has a charge circuit 13, discharge circuit 14 for discharging electric charge stored in the charge circuit 13, a comparator circuit 15 for comparing an output voltage from the charge circuit 13 with a reference voltage Vref1, and a control circuit 18 for controlling the discharge circuit 14. The control circuit provides a charge signal to a switch SW2 in the discharge circuit 14.

The charge circuit 13 has a differential amplifier AMP1 with its non-inverted input terminal connected to a ground (0V), and a capacitor C1 connected between an inverted input terminal and an output terminal of the differential amplifier AMP1. An electric charge corresponding to the input current Iin is stored in the capacitor C1.

The discharge circuit 14 has a reference current source 1101 with one end connected to a power supply voltage Vdd, and the switch SW2 connected between the other end of the reference current source 1101 and the non-inverted input terminal of the differential amplifier AMP1 of the charge circuit 13.

The comparator circuit 15 has a comparator CMP1 with its non-inverted input terminal connected to the output terminal of the differential amplifier AMP1 of the charge circuit 13, a reference voltage source E3 with its positive electrode connected to an inverted input terminal of the comparator CMP1 and with its negative electrode connected to a ground, and a switch SW1 with one end connected to the output terminal of the differential amplifier AMP1 of the charge circuit 13 and with the other end connected to the positive electrode of the reference voltage source E3. The switch SW1 is turned on and off by a control signal, which is not shown.

The control circuit 18 has a D-flip-flop (referred to as D-FF below) 16 which receives a comp signal from the comparator circuit 15, and a counter circuit 17 which generates and outputs a digital value corresponding to a number of dischargings of the charge circuit 13 based on a charge signal received from the D-FF 16. A clk signal (not shown) is input to the D-FF 16.

Initially, an output voltage Vsig of the charge circuit 13 is at the reference voltage Vref1 because the switch SW1 is initially closed. Then, during the analog to digital conversion period t_conv, the switch SW1 is open, so that the input current Iin is charged or stored in the capacitor C1 of the charge circuit 13 and the analog to digital conversion is performed upon the input current Iin in the following manner.

First, the switch SW2 of the discharge circuit 14 is closed with the switch SW1 kept open so that a fixed quantity of electric charge (I1×t_clk) is discharged from the capacitor C1 of the charge circuit 13 (a precharge operation).

Then, upon opening the switch SW2 of the discharge circuit 14, the charge circuit 13 is charged by the input current Iin. Once the output voltage Vsig of the charge circuit 13 exceeds the reference voltage Vref1, the comp signal of the comparator circuit 15 assumes a high level.

Once the comp signal of the comparator signal 15 assumes a high level, the charge signal of the D-FF 16 also assumes a high level with some delay.

Next, with the switch SW2 of the discharge circuit 14 closed again, the fixed quantity of electric charge (I1×t_clk) is discharged from the capacitor C1 of the charge circuit 13 by the discharge circuit 14.

Next, once the output voltage Vsig of the charge circuit 13 decreases to less than the reference voltage Vref1, the comp signal of the comparator circuit 15 assumes a low level and then the charge signal of the D-FF 16 also assumes a low level with some delay.

In this way, charging and discharging operations are performed by repeating the opening and closing operations of the switch SW2 of the discharge circuit 14. Then, the counter circuit 17 counts the number of times that the charge signal assumes a high level during the given analog to digital conversion period and outputs a digital value corresponding to a quantity of electric charge input to the capacitor C1 by input current Iin.

Figure 3:
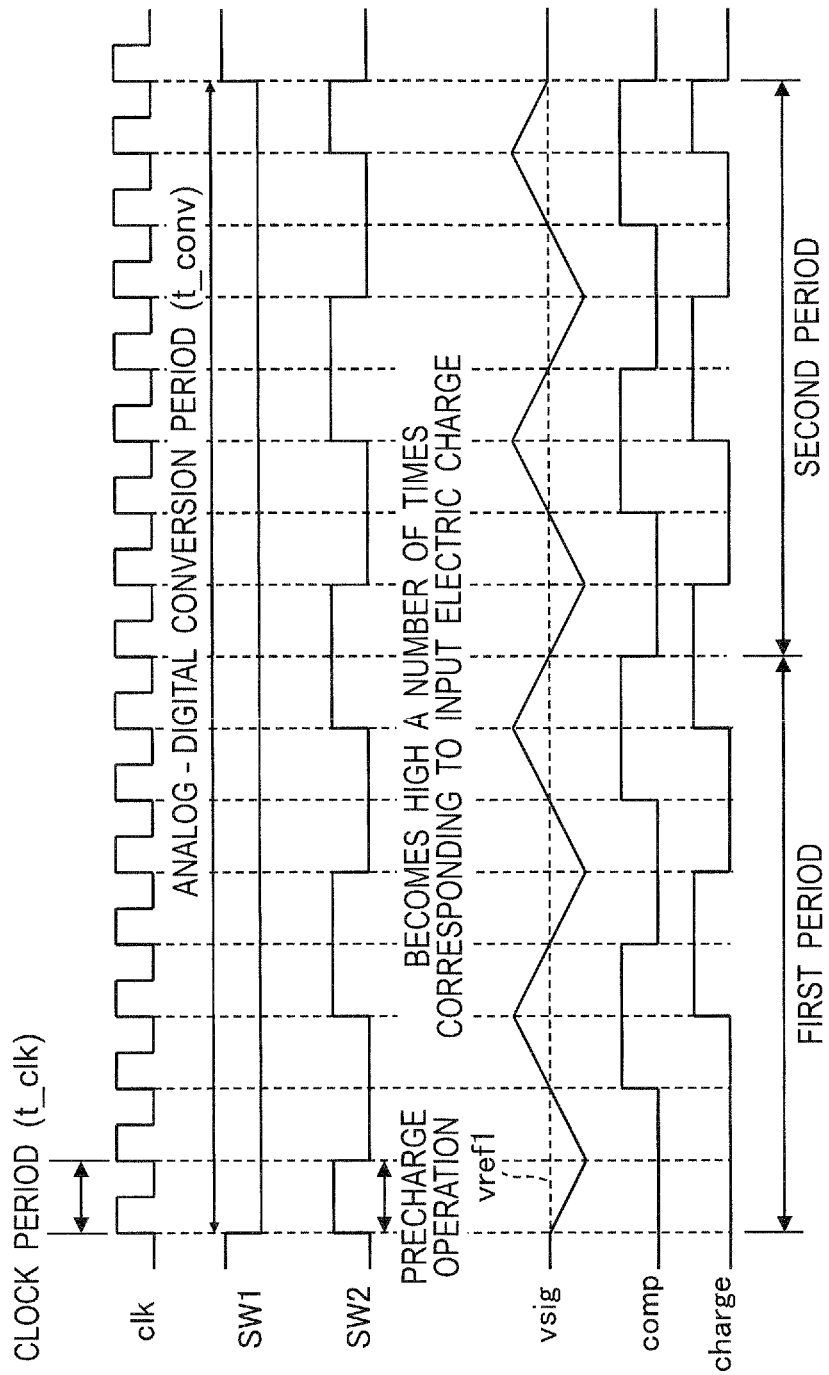
FIG. 3 shows operational waveforms in the integral type analog to digital converter.

FIG. 3 shows operational waveforms of the analog to digital converter shown in FIG. 2.

This analog to digital converter operates such that the quantity of electric charge of the input current Iin stored in the capacitor C1 of the charge circuit 13 is equal to the quantity of electric charge discharged from the capacitor C1 by the discharge circuit 14; the quantities of electric charges stored and discharged are as follows:

Quantity of electric charge stored=$I\text{in} \times t\_\text{conv}$, and

Quantity of electric charge discharged=$I1 \times t\_\text{clk} \times \text{count}$.

Because the quantity of electric charge stored is equal to the quantity of electric charge discharged, count will be expressed as follows:

$$\text{count} = (I\text{in} \times t\_\text{conv})/(I1 \times t\_\text{clk}),$$

where t_clk is a clock period, t_conv is an analog to digital conversion period, count is a number of counts of discharging, and I1 is an amount of the reference current. A minimum resolution is determined by (I1×t_clk).

Given that charging is performed during the analog to digital conversion period t_conv=t_clk×$2^n$, where n is a resolution, the value of count will be as follows:

$$\text{count} = I\text{in}/I1 \times 2^n$$

Given that the resolution n is 6 bits by way of example, the value of count will range from 0 to 65535 in accordance with the input current Iin.

Inclusion of the integral type analog to digital converter allows the analog to digital conversion device to perform analog to digital conversion with a wide dynamic range and a high resolution.

Second Embodiment

Figure 4:
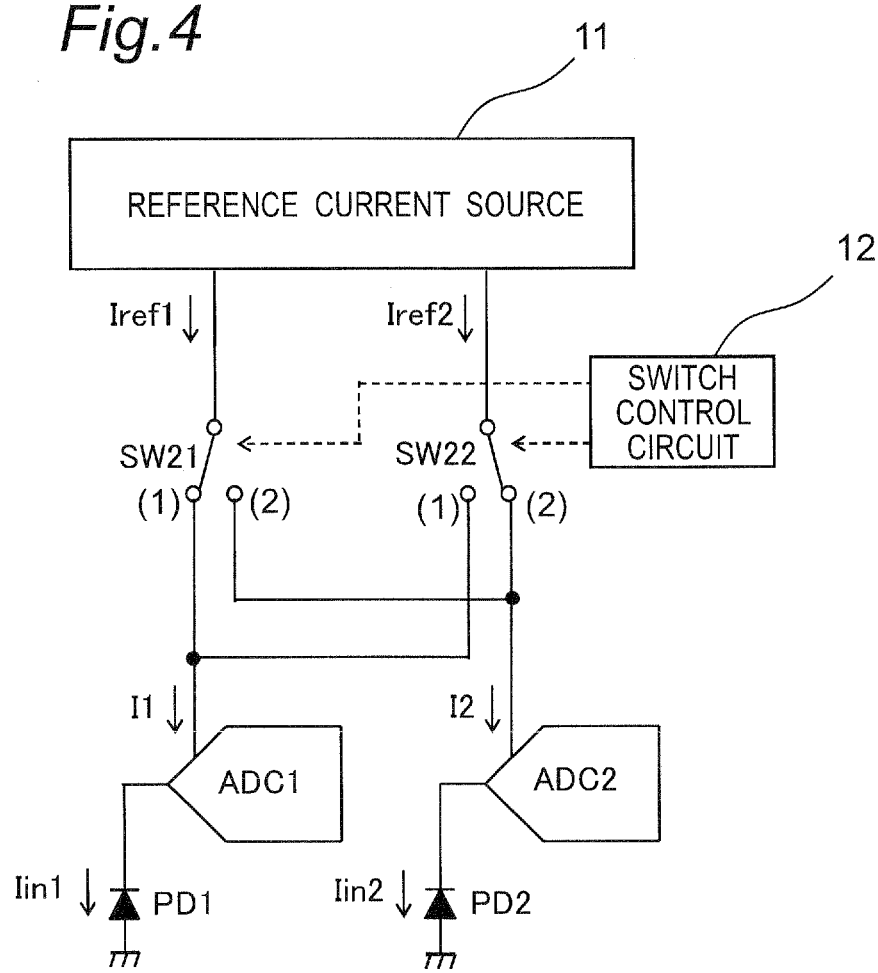
FIG. 4 shows a diagram illustrating a configuration of an illuminance sensor device using an analog to digital conversion device according to a second embodiment of the present invention.

FIG. 4 shows a diagram illustrating a configuration of an illuminance sensor device using an analog to digital conversion device according to a second embodiment of the invention. The analog to digital conversion device of the second embodiment has the same configuration as the analog to digital conversion device of the first embodiment, except that first and second photodiodes PD1 and PD2 are added in the second embodiment, and same parts are given same reference numerals or symbols in the figures.

The analog to digital conversion device of the first embodiment shown in FIG. 1 is modified such that as shown in FIG. 4, input current Iin1 from the first photodiode PD1 having spectral characteristics of an infrared region and input current Iin2 from the second photodiode PD2 having spectral characteristics of from a visible to an infrared region (i.e., a region ranging from a visible region to an infrared region), are input into the analog to digital converters ADC1, ADC2 of the analog to digital conversion device.

Figure 5:
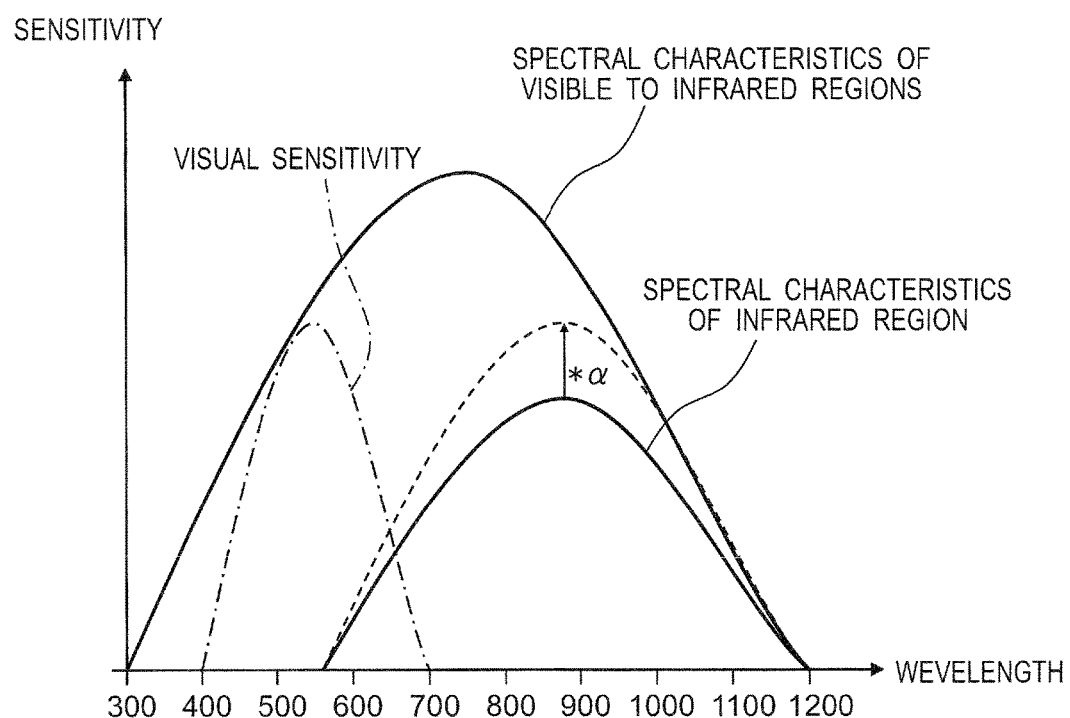
FIG. 5 shows spectral characteristics of photodiodes in the illuminance sensor device.

FIG. 5 shows spectral characteristics of the photodiodes PD1, PD2 by way of example.

In the illuminance sensor device, the input current Iin1 is converted to a digital value ADCOUNT1 through the conversion by the first analog to digital converter ADC1, and the input current Iin2 is converted to a digital value ADCOUNT2 through the conversion by the second analog to digital converter ADC2.

In the illuminance sensor device, operations of multiplying the digital value ADCOUNT1 by α and then subtracting the outcome from the digital value ADCOUNT2 are performed, with a result of the operations expressed as:

$$ADCOUNT2 - ADCOUNT1 \times \alpha,$$

which indicates that spectral characteristics close to the visual sensitivity characteristic can be obtained. In the above expression, α may be set at any suitable value in view of the spectral characteristics of the photodiode PD1.

In the illuminance sensor device of the second embodiment, an error due to the reference quantity of electric charge (the reference current), which is one of factors of the error in characteristics between the analog to digital converters ADC1 and ADC2, can be eliminated, so that an error in operation results can be reduced. As a result, highly accurate measurement of illuminance is achievable.

Third Embodiment

As a method of supplying reference quantities of electric charge to the analog to digital converters, there is a scheme using reference capacitors, in addition to the scheme of supplying reference currents as in the first embodiment, A fundamental configuration of an analog to digital conversion device using reference capacitors shown in FIG. 6 will be described below before illustrating the analog to digital conversion device according to a third embodiment of the present invention. It should be noted that the analog to digital conversion device shown in FIG. 6 is not a device according to the present invention.

Figure 6:
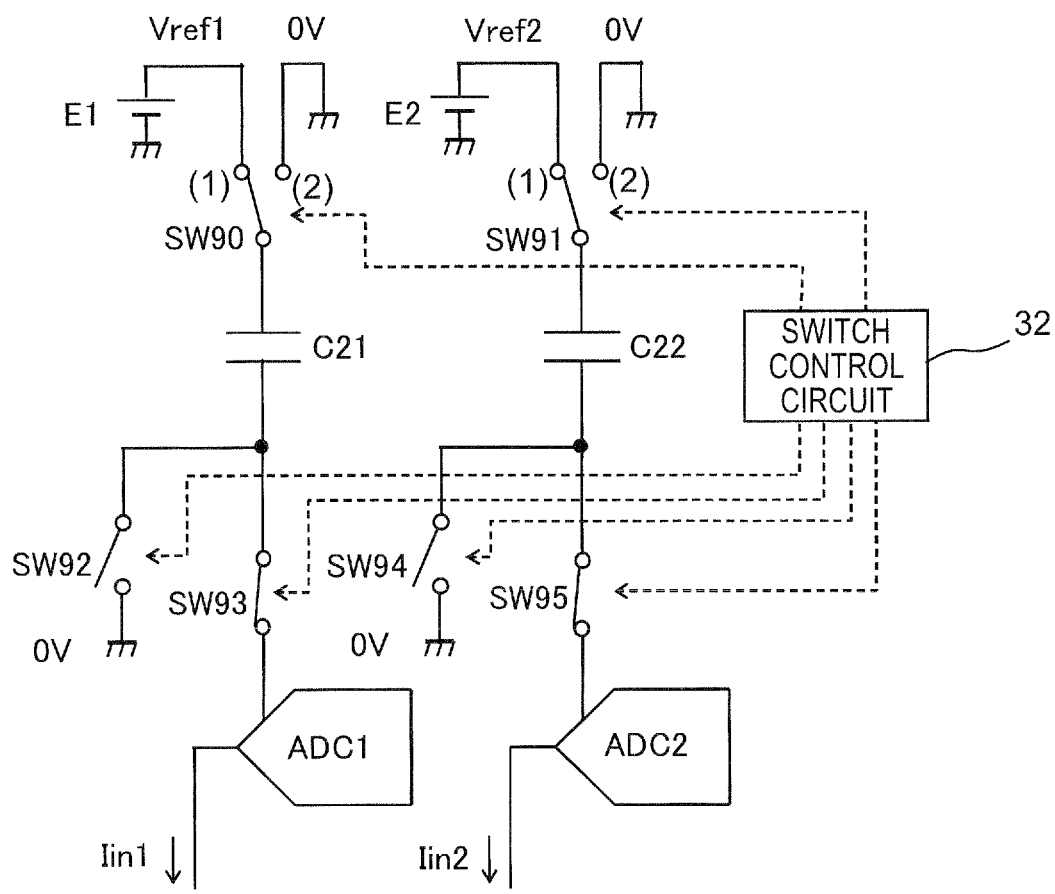
FIG. 6 shows a diagram illustrating a configuration of an analog to digital conversion device using reference capacitors.

The analog to digital conversion device of FIG. 6 has two DC voltage sources E1, E2, a switch SW90 for switching between a reference voltage Vref1 from the DC voltage source E1 and a ground (0 V), a switch SW91 for switching between a reference voltage Vref2 from the DC voltage source E2 and 0 V, a reference capacitor C21 with one end connected to an output terminal of the switch SW90, a reference capacitor C22 with one end connected to an output terminal of the switch SW91, a switch SW92 with one terminal connected to the other end of the reference capacitor C21 and with the other terminal connected to the ground (0 V), a switch SW93 with one terminal connected to the other end of the reference capacitor C21, a switch SW94 with one terminal connected to the other end of the reference capacitor C22 and with the other terminal connected to the ground (0 V), a switch SW95 with one terminal connected with the other end of the reference capacitor C21, an analog to digital converter ADC1 connected to the other terminal of the switch SW93, an analog to digital converter ADC2 connected to the other terminal of the switch SW95, and a switch control circuit 32 for controlling the switches SW90-SW95.

The switches SW90-SW95 and the switch control circuit 32 constitute a reference charge quantity interchange section.

In the above analog to digital conversion device, the reference capacitor C21, C22 is connected to one of the two input terminals of a feedback differential amplifier (not shown) in the associated analog to digital converter ADC1, ADC2, with the one input terminal being virtually shorted with the other input terminal (0 V) of the feedback differential amplifier.

In the analog to digital conversion device, once the switch SW90 is switched to position (2), the switch SW92 is closed, and the switch SW93 is opened under control of the switch control circuit 32, the reference capacitor C21 assumes a non-charged state in which no electric charge is stored (state 1). Then, with the switch SW90 switched to position (1), the switch SW92 is opened and the switch SW93 is closed, so that electric charge of C21×Vref1 is stored in the reference capacitor C21. The electric charge, which is positive, of C21×Vref1 is supplied to the first analog to digital converter ADC1 (state 2). The alternate state 1 and state 2 are repeated under control of the switch control circuit 32, with the result that an electric charge quantity that is an integral multiple of C21×Vref1 is supplied to the first analog to digital converter ADC1.

Similarly, once with switch SW91 switched to position (2), the switch SW94 is closed and the switch SW95 is opened under control of the switch control circuit 32, the reference capacitor C22 assumes a non-charged state in which no electric charge is stored (state 3). Then, with the switch SW91 switched to position (1), the switch SW94 is opened and the switch SW95 is closed, so that electric charge of C22×Vref2 is stored in the reference capacitor C22. The electric charge, which is positive, of C22×Vref2 is supplied to the second analog to digital converter ADC2 (state 4). The alternate state 3 and state 4 are repeated under control of the switch control circuit 32, with the result that an electric charge quantity that is an integral multiple of C22×Vref2 is supplied to the second analog to digital converter ADC2.

Figure 7:
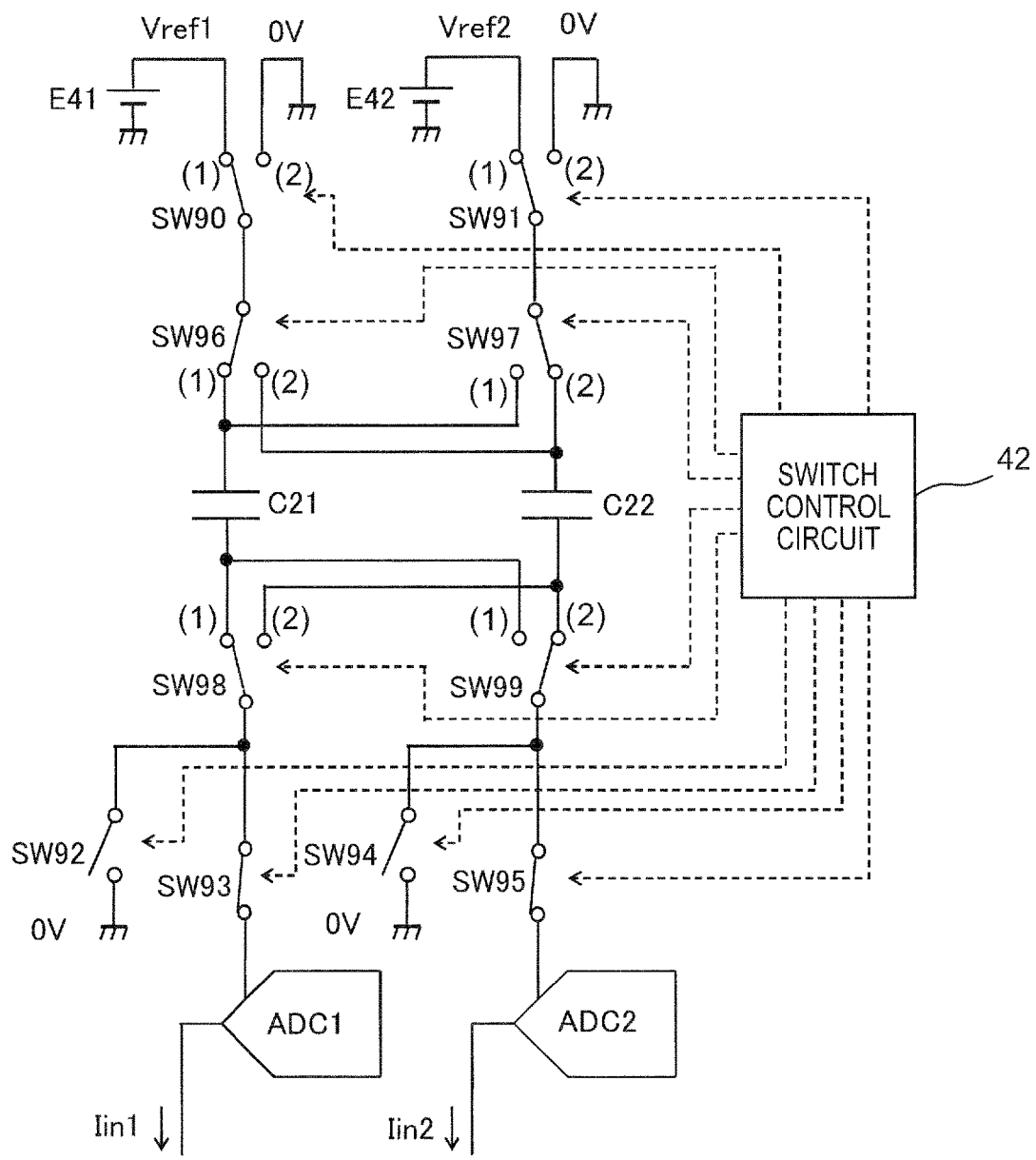
FIG. 7 shows a diagram illustrating a configuration of an analog to digital conversion device using reference capacitors according to a third embodiment of the present invention.

FIG. 7 shows the configuration of the analog to digital conversion device according to the third embodiment of the present invention, which is the same as the configuration of the analog to digital conversion device of FIG. 6 except for switches 96-99 and a switch control circuit 42.

As shown in FIG. 7, the analog to digital conversion device of the third embodiment has two DC voltage sources E41, E42, a switch SW90 for switching between a reference voltage Vref1 from the DC voltage source E41 and the ground (0 V), and a switch SW91 for switching between a reference voltage Vref2 from the DC voltage source E42 and 0 V. The device also has a switch SW96 with an input terminal connected to an output terminal of the switch 90, a reference capacitor C21 with one end connected to an output terminal (1) of the switch SW96, a switch SW97 with an input terminal connected to an output terminal of the switch 91, a reference capacitor C22 with one end connected to an output terminal (2) of the switch SW97, a switch SW98 with an input terminal (1) connected to the other end of the reference capacitor C21, a switch SW99 with an input terminal (2) connected to the other end of the reference capacitor C22, a switch SW92 with one end connected to an output terminal of the switch SW98 and with the other end connected to the ground (0 V), a switch SW93 with one end connected to the output terminal of the switch SW98, a switch SW94 with one end connected to an output terminal of the switch SW99 and with the other end connected to the ground (0 V), and a switch SW95 with one end connected to the output terminal of the switch SW98. The device further has an analog to digital converter ADC1 connected to the other terminal of the switch SW93, an analog to digital converter ADC2 connected to the other terminal of the switch SW95, and a switch control circuit 42 for controlling the switches SW90-SW99.

The output terminal (1) of the switch SW96 is connected to the output terminal (1) of the switch SW97. The output terminal (2) of the switch SW96 is connected to the output terminal (2) of the switch SW97. The input terminal (1) of the switch SW98 is connected to the input terminal (1) of the switch SW99. The input terminal (2) of the switch SW98 is connected to the input terminal (2) of the switch SW98.

The switches SW90-SW99 and the switch control circuit 42 constitute a reference charge quantity interchange section.

In the above analog to digital conversion device, the switches SW90-SW95 function as in the analog to digital conversion device of the third embodiment, under control of the switch control circuit 42 during the analog to digital conversion period.

The analog to digital conversion device has a function of interchanging the reference capacitors between the analog to digital converters ADC1, ADC2 during the analog to digital conversion period. That is, each of the two analog to digital converters ADC1, ADC2 uses both of the two reference capacitors C21, C22 by time-division scheme.

The analog to digital conversion device changes the positions or states of each of the switches SW96-SW99 during the analog to digital conversion period by the switch control circuit 42 in the following manner.

In a first period, i.e., a first half of the analog to digital conversion period, the switch SW96 is switched to position (1), the switch SW97 to position (2), the switch SW98 to position (1) and the switch SW99 to position (2) so that the reference capacitor C21 is used for the first analog to digital converter ADC1 and the reference capacitor C22 is used for the second analog to digital converter ADC2.

In a second period, i.e., a second half of the analog to digital conversion period, the switch SW96 is switched to position (2), the switch SW97 to position (1), the switch SW98 to position (2) and the switch SW99 to position (1) so that the reference capacitor C22 is used for the first analog to digital converter ADC1 and the reference capacitor C21 is used for the second analog to digital converter ADC2.

Such switching can reduce error in characteristics between the two analog to digital converters ADC1, ADC2 even if there is a difference between capacitances of the reference capacitors C21 and C22.

In the case of equally providing the first and second periods in one analog to digital conversion period, that is, in the case of interchanging the reference capacitors C21, C22 to be used in the two analog to digital converters ADC1, ADC2 every half of the analog to digital conversion period so that the reference capacitors C21, C22 are alternately used in each analog to digital converter every half of the analog to digital conversion periods, the reference capacitances in the two analog to digital converters ADC1, ADC2 can be equalized, resulting in that error in characteristics due to difference in reference capacitance between the analog to digital converters ADC1, ADC2 can be eliminated.

When using a plurality of analog to digital converters (i.e., n analog to digital converters) and a plurality of reference capacitors (i.e., n reference capacitors) as well, the reference capacitors to be used in the n analog to digital converters may be interchanged among the n analog to digital converters every one-nth of the analog to digital conversion period so that each analog to digital converter uses the n reference capacitors in turn in each one-nth of the analog to digital conversion period. Thus, it is apparent that in this case as well, the reference capacitances used in each analog to digital converter can be equalized among these analog to digital converters, resulting in that error in characteristics due to difference in reference capacitance among the analog to digital converters can be eliminated.

Figure 8:
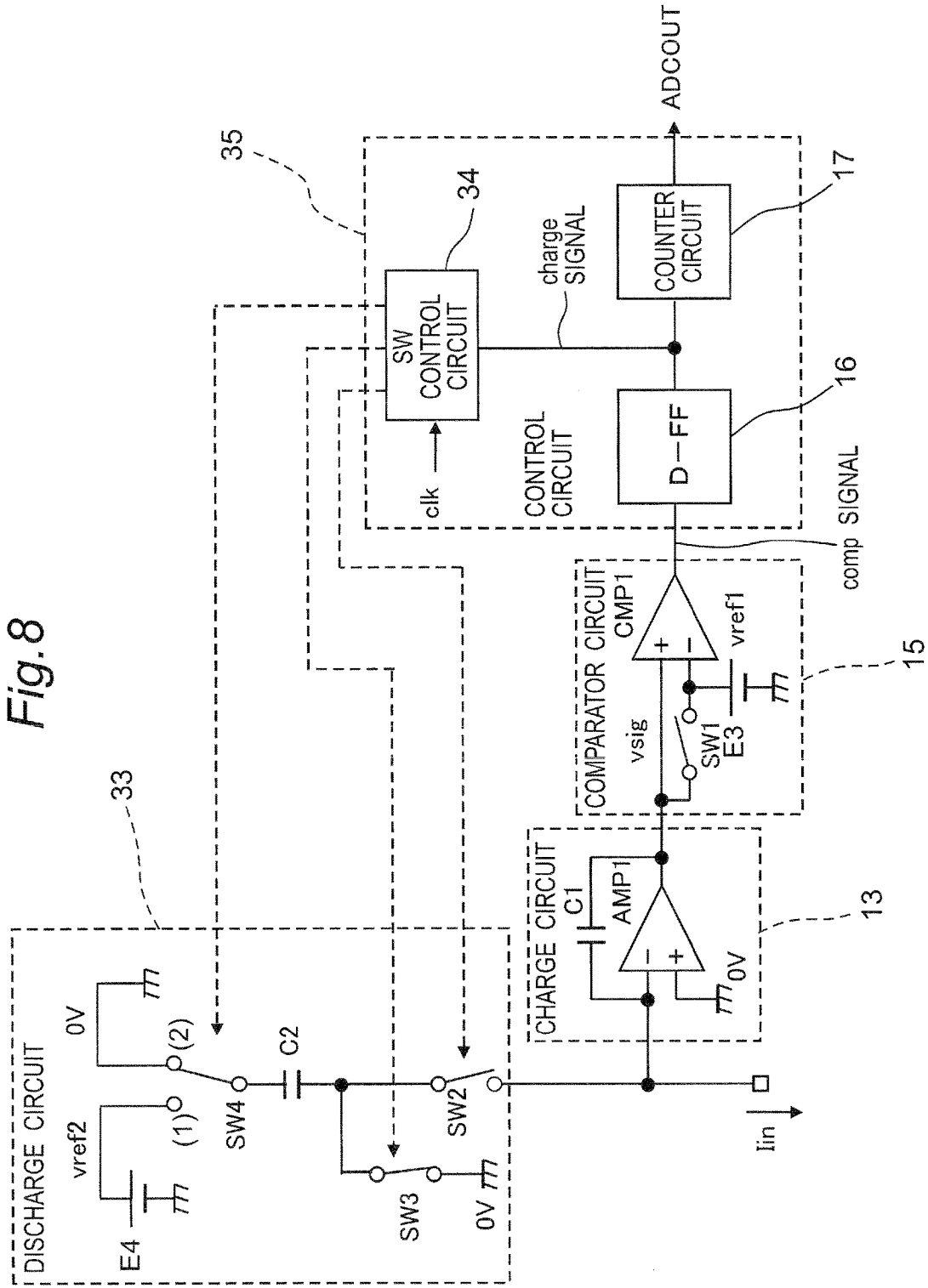
FIG. 8 shows a diagram illustrating a configuration of an example of the integral type analog to digital converter to be used in the analog to digital conversion device.

FIG. 8 shows a diagram illustrating a configuration of an example of the integral type analog to digital converter to be used in the analog to digital conversion device of the third embodiment. This analog to digital converter has the same configuration as that of the analog to digital converter of FIG. 2, except for a discharge circuit and an SW control circuit, and same parts are given same reference numerals or symbols in the figures.

This analog to digital converter is a circuit that converts an amount of input current Iin to a digital value and outputs the digital value. As shown in FIG. 8, the analog to digital converter has a charge circuit 13, a discharge circuit 33 for discharging electric charge stored in the charge circuit 13, a comparator circuit 15 for comparing an output voltage from the charge circuit 13 with a reference voltage Vref1, and a control circuit 18 for controlling the discharge circuit 33.

The discharge circuit 33 has a switch SW4 with one input terminal connected to a reference voltage source E4 and with the other input terminal connected to the around (0 V), a reference capacitor C2 with one end connected to an output terminal of the switch SW4, a switch SW2 with one end connected to the other end of the reference capacitor C2 and with the other end connected to a non-inverted input terminal of a differential amplifier AMP1 of the charge circuit 13, and a switch SW3 with one end connected to the other end of the reference capacitor C2 and with the other end connected to the ground (0 V).

The control circuit 35 has D-flip-flop (referred to as D-FF below) 16 that receives a comp signal from the comparator circuit 15, and a counter circuit 17 which generates and outputs a digital value corresponding to a number of dischargings of the charge circuit 13 based on a charge signal received from the D-FF 16. The control circuit 35 also has a switch control circuit 34 (referred to as "SW control circuit 34" below) for controlling the switches SW2-SW4 based on the charge signal. A clk signal (not shown) is input to the D-FF 16.

In this case where the reference capacitor C2 is used, a fixed quantity of electric charge (C2×Vref2×t_clk) is discharged from the capacitor C1 of the charge circuit 13 (a precharge operation).

This analog to digital converter operates such that the quantity of electric charge of the input current Iin stored in the capacitor C1 of the charge circuit 13 is equal to the quantity of electric charge discharged from the capacitor C1 by the discharge circuit 14; the quantities of electric charges stored and discharged are as follows:

Quantity of electric charge stored=$I\text{in} \times t\_\text{conv}$, and

Quantity of electric charge discharged=$C2 \times V\text{ref2} \times t\_\text{clk} \times \text{count}$.

Because the quantity of electric charge stored is equal to the quantity of electric charge discharged, count will be expressed as follows:

count=$(I\text{in} \times t\_\text{conv})/(C2 \times V\text{ref2} \times t\_\text{clk})$, where t_clk is a clock period, t_conv is an analog to digital conversion period, count is a number of counts of discharging, C2 is a reference capacitance, and Vref2 is a reference voltage value. A minimum resolution is determined by (C2×Vref2×t_clk).

Applying the integral type analog to digital converters shown in FIG. 8 to the analog to digital conversion device allows the device to perform analog to digital conversion with a wide dynamic range and a high resolution.

Because the analog to digital converters are of integral type, the reference quantities of electric charge (reference capacitances) to be used in the n analog to digital converters can be interchanged among the n analog to digital converters every one-nth of the analog to digital conversion period so that each analog to digital converter uses the n reference quantities of electric charge (reference capacitances) in turn in each one-nth of the analog to digital conversion period. Thus, the analog to digital conversion can be done with high accuracy.

Fourth Embodiment

Figure 9:
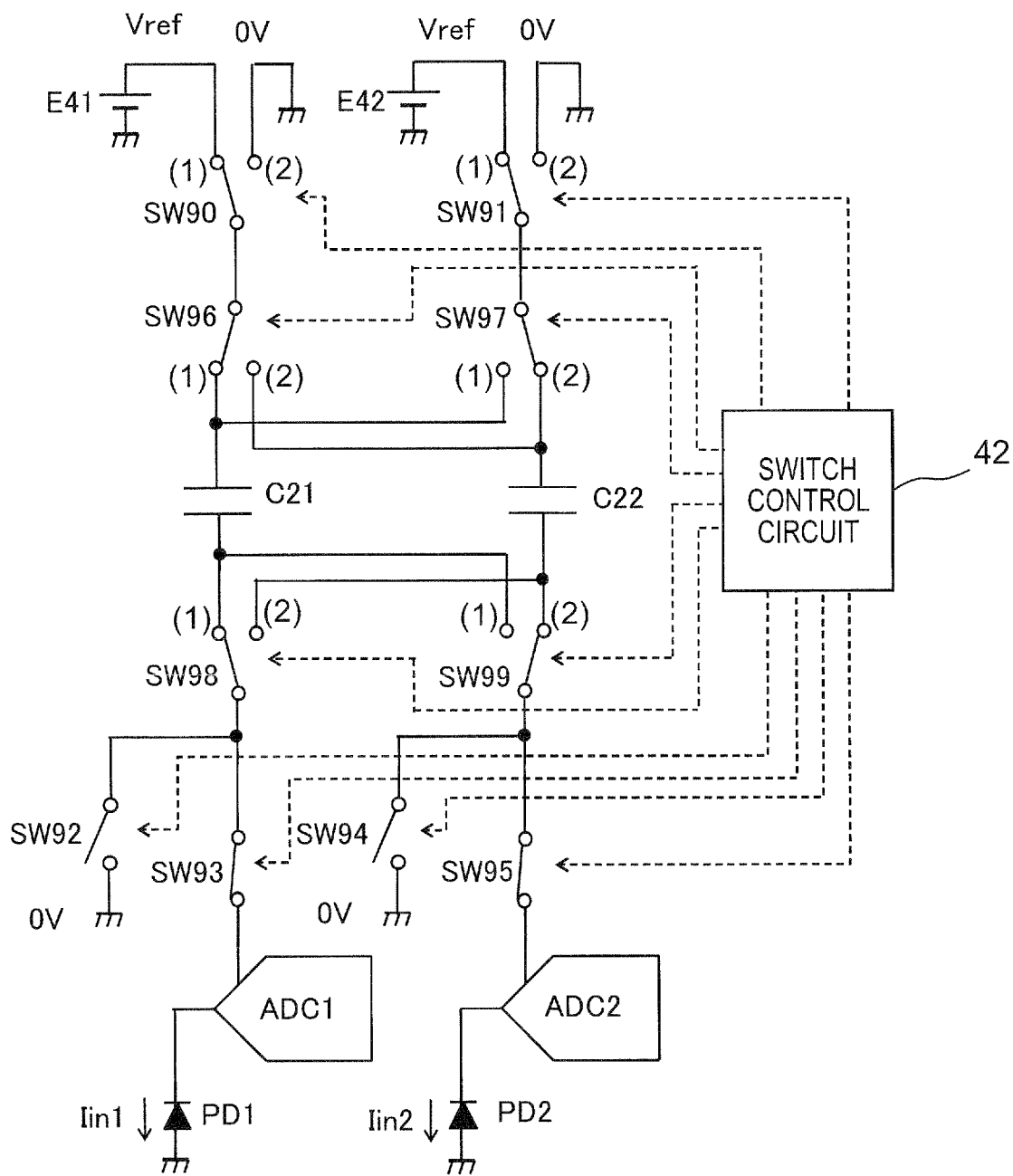
FIG. 9 shows a diagram illustrating a configuration of an illuminance sensor device using an analog to digital conversion device according to a fourth embodiment of the present invention.

FIG. 9 shows a diagram illustrating a configuration of an illuminance sensor device using an analog to digital conversion device according to a fourth embodiment of the present invention. The analog to digital conversion device of the fourth embodiment has the same configuration as the analog to digital conversion device of the third embodiment, except for first and second photodiodes PD1 and PD2 in the fourth embodiment, and same parts are given same reference numerals or symbols in the figures.

The analog to digital conversion device of the fourth embodiment is the analog to digital conversion device of the third embodiment of FIG. 7 modified such that as shown in FIG. 9, input current Iin1 from the first photodiode PD1 having spectral characteristics of the infrared region and input current Iin2 from the second photodiode PD2 having spectral characteristics of from the visible to the infrared region are input into the two analog to digital converters ADC1, ADC2 which each use two reference quantities of electric charge (reference capacitances).

The spectral characteristics of the photodiodes PD1 and PD2 are the same as those shown in FIG. 5.

In the illuminance sensor device, the input current Iin1 is converted to a digital value ADCOUNT1 through the conversion by the first analog to digital converter ADC1, and the input current Iin2 is converted to a digital value ADCOUNT2 through the conversion by the second analog to digital converter ADC2.

In the illuminance sensor device, operations of multiplying the digital value ADCOUNT 1 by α and then subtracting the outcome from the digital value ADCOUNT2 are performed, with a result of the operations expressed as:

$$ADCOUNT2 - ADCOUNT1 \times \alpha,$$

which indicates that spectral characteristics close to the visual sensitivity characteristic can be obtained. In the above expression, a may be set at any suitable value in view of the spectral characteristics of the photodiode PD1.

In the illuminance sensor device of the fourth embodiment, an error due to the reference quantity of electric charge (reference capacitance), which is one of factors of the error in characteristics between the analog to digital converters, can be eliminated, so that an error in operation results can be reduced. As a result, highly accurate measurement of illuminance is achievable.

Fifth Embodiment

Figure 10:
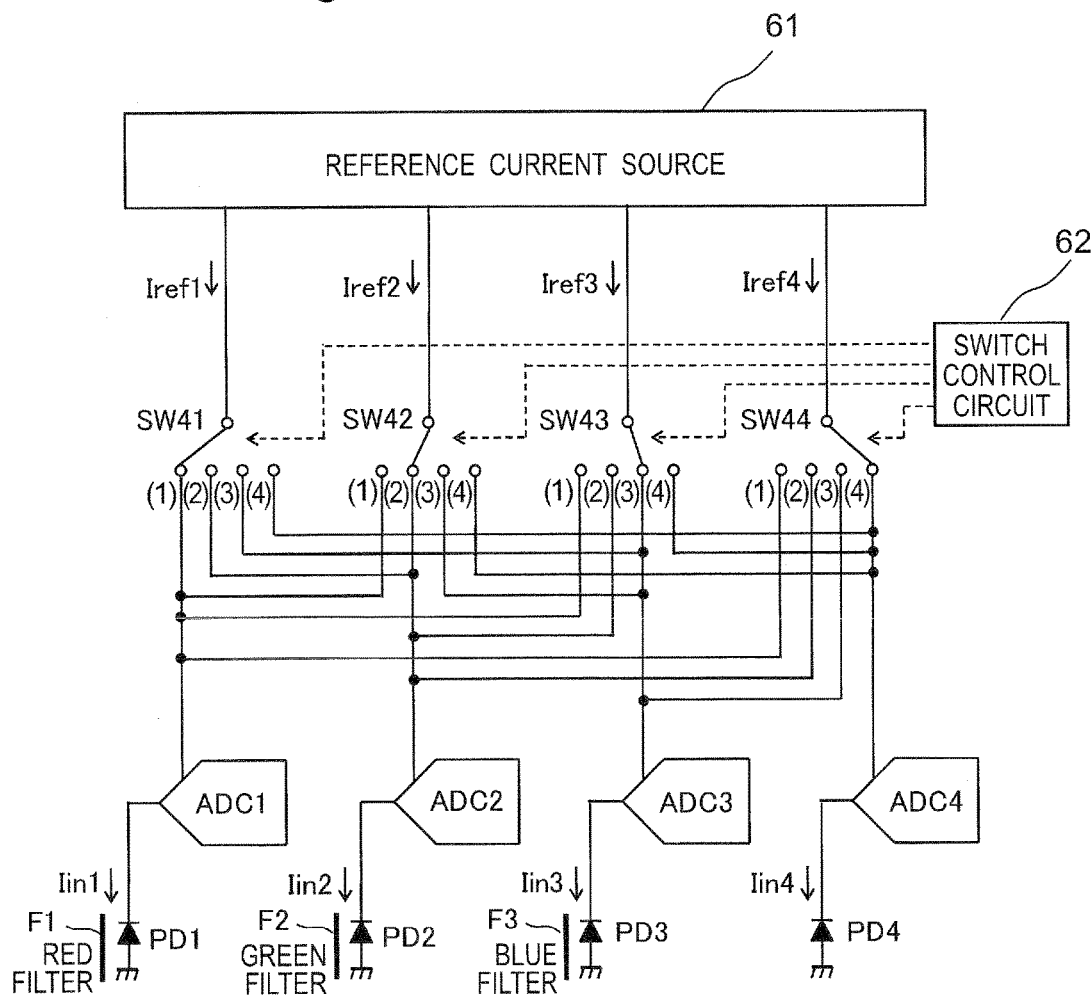
FIG. 10 shows a diagram illustrating a configuration of a color illuminance sensor device using an analog to digital conversion device according to a fifth embodiment of the present invention.

FIG. 10 shows a diagram illustrating a configuration of a color illuminance sensor device using an analog to digital conversion device according to a fifth embodiment of the present invention.

As shown in FIG. 10, the color illuminance sensor device of the fifth embodiment has four analog to digital converters ADC1-ADC4, a reference current source 61 for generating four reference currents Iref1-Tref4, a switch SW41 for switching the reference current Iref1 from the current source 61 among the analog to digital converters, a switch SW42 for switching the reference current Iref2 from the reference current source 61 among the analog to digital converters, a switch SW43 for switching the reference current Iref3 from the current source 61 among the analog to digital converters, a switch SW44 for switching the reference current Iref4 from the reference current source 61 among the analog to digital converters, and a switch control circuit 62 for controlling the switches SW41-SW44.

The color illuminance sensor device also has a red filter F1 transmitting light in a red region, a green filter F2 transmitting light in a green region, and a blue filter F3 transmitting light in a blue region.

The switches SW41-SW44 and the switch control circuit 62 constitute a reference charge quantity interchange section In the color illuminance sensor device, as shown in FIG. 10, the to fourth analog to digital converters ADC1-ADC4 each using four reference quantities of electric charge (reference currents) are supplied with the input currents Iin1, Iin2, Iin3 of the first to third photodiodes PD1, PD2, PD3 and the input current Iin4 of the fourth photodiode PD4 having spectral characteristics of from the visible to the infrared region.

In the color illuminance sensor device, as in the analog to digital conversion device of the second embodiment using two analog to digital converters, one analog to digital conversion period is divided into, in this case, quarters, namely, first to fourth periods each having a length of one fourth of the analog to digital conversion period, during which the switches SW41-Sw44 are controlled by the switch control circuit 62 in the following manner.

In the first period, the switch SW41 is switched to (1), the switch SW42 to (2), the switch SW43 to (3), and the switch SW44 to (4).

Next, in the second period, the switch SW41 is switched to (2), the switch SW42 to (3), the switch SW43 to (4), and the switch SW44 to (1).

Next, in the third period, the switch SW41 is switched to (3), the switch SW42 to (4), the switch SW43 to (1), and the switch SW44 to (2).

Next, in the fourth period, the switch SW41 is switched to (4), the switch SW42 to (1), the switch SW43 to (2), and the switch SW44 to (3).

Thus, the first analog to digital converter ADC1 is supplied with the reference currents Iref1, Iref2, Iref3, and Iref4 in order in the respective quarters of the analog to digital conversion period. The second analog to digital converter ADC2 is supplied with the reference currents Iref2, Iref3, Iref4 and Iref1 in order in the respective quarters of the analog to digital conversion period. The third analog to digital converter ADC3 is supplied with the reference currents Iref3, Iref4, Iref1 and Iref2 in order in the respective quarters of the analog to digital conversion period. The fourth analog to digital converter ADC4 is supplied with the reference currents Iref4, Iref1, Iref2 and Iref3 in order in the respective quarters of the analog to digital conversion period.

In this way, the reference currents Iref1-Iref4 are interchanged among the analog to digital converters ADC1-ADC4 every quarter of the analog to digital conversion period so that the amounts of the four reference currents used in each analog to digital converter can be equalized among these analog to digital converters, resulting in that error in characteristics due to difference in reference current among the analog to digital converters ADC1-ADC4 can be eliminated.

In the color illuminance sensor device, the following digital operations are performed upon digital values ADCOUNT1-ADCOUNT4 which are analog to digital conversion results by the analog to digital convers ADC1-ADC4 respectively:

$$ADCOUT1 \times ADCOUNT2 \times \beta + ADCOUNT3 \times \gamma - ADCOUNT4 \times \epsilon$$

As a result of the above digital operations, spectral characteristics close to the visual sensitivity characteristics. $\alpha$, $\beta$, $\gamma$ and $\epsilon$ may be set at any suitable values according to the spectral characteristics of the photodiodes PD1, PD2, PD3, and PD4.

Sixth Embodiment

Figure 11:
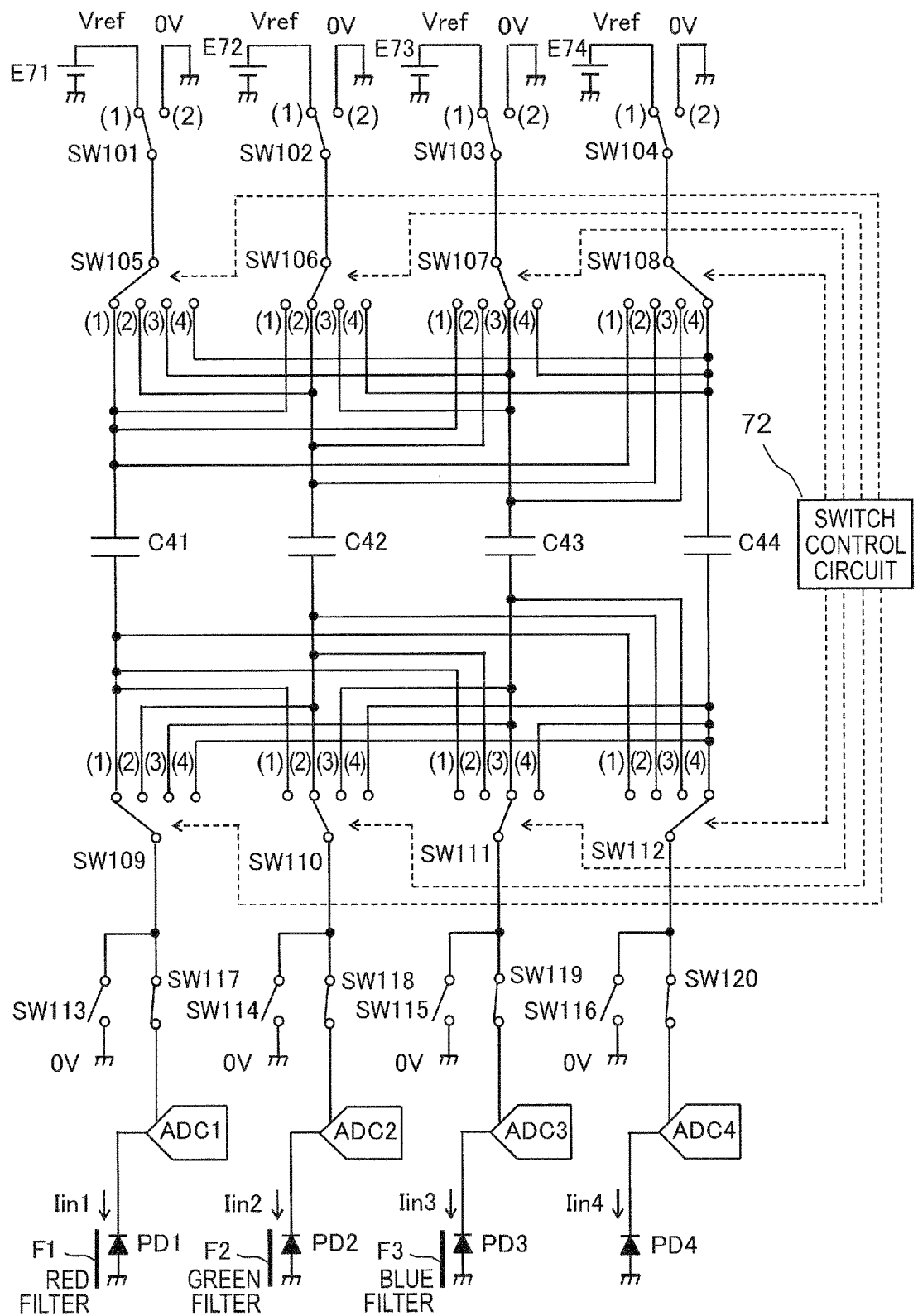
FIG. 11 shows a diagram illustrating a configuration of a color illuminance sensor device using an analog to digital conversion device according to a sixth embodiment of the present invention.

FIG. 11 shows a diagram illustrating a configuration of a color illuminance sensor device using an analog to digital conversion device according to a sixth embodiment of the present invention.

As shown in FIG. 11, the color illuminance sensor device of the sixth embodiment has four DC voltage sources E71-E74, a switch SW101 for switching between a reference voltage Vref1 from the DC voltage source E71 and the ground (0 V), a switch SW102 for switching between a reference voltage Vref2 from the DC voltage source E72 and 0 V, a switch SW103 for switching between a reference voltage Vref3 from the DC voltage source E73 and the ground (0 V), and a switch SW104 for switching between a reference voltage Vref4 from the DC voltage source E74 and 0 V. The device also has a switch SW105 with an input terminal connected to an output terminal of the switch 101, a reference capacitor C41 with one end connected to an output terminal (1) of the switch SW105, a switch SW106 with an input terminal connected to an output terminal of the switch 102, a reference capacitor C42 with one end connected to an output terminal (2) of the switch SW106, a switch SW107 with an input terminal connected to an output terminal of the switch 103, a reference capacitor C43 with one end connected to an output terminal (3) of the switch SW107, a switch SW108 with an input terminal connected to an output terminal of the switch 104, and a reference capacitor C44 with one end connected to an output terminal (4) of the switch SW108. The device also has a switch SW109 with an input terminal (1) connected to the other end of the reference capacitor C41, a switch SW110 with an input terminal (2) connected to the other end of the reference capacitor C42, a switch SW111 with an input terminal (3) connected to the other end of the reference capacitor C43, a switch SW112 with an input terminal (4) connected to the other end of the reference capacitor C44, a switch SW113 with one end connected to an output terminal of the switch SW109 and with the other end connected to the ground (0 V), a switch SW117 with one end connected to the output terminal of the switch SW109, a switch SW114 with one end connected to an output terminal of the switch SW110 and with the other end connected to the ground (0 V), a switch SW118 with one end connected to the output terminal of the switch SW110, a switch SW115 with one end connected to an output terminal of the switch SW111 and with the other end connected to the ground (0 V), a switch SW119 with one end connected to the output terminal of the switch SW111, a switch SW116 with one end connected to an output terminal of the switch SW112 and with the other end connected to the ground (0 V), and a switch SW120 with one end connected to the output terminal of the switch SW112. The device further has a first analog to digital converter ADC1 connected to the other terminal of the switch SW117, a second analog to digital converter ADC2 connected to the other terminal of the switch SW118, a third analog to digital converter ADC3 connected to the other terminal of the switch SW119, a fourth analog to digital converter ADC4 connected to the other terminal of the switch SW120, and a switch control circuit 72 for controlling the switches SW101-SW120.

The output terminals (1) of the switches SW105-SW108 are connected to one another. The output terminals (2) of the switches SW105-SW108 are connected to one another. The output terminals (3) of the switches SW105-SW108 are connected to one another. The output terminals (4) of the switches SW105-SW108 are connected to one another. The input terminals (1) of the switches SW109-SW112 are connected to one another. The input terminals (2) of the switches SW109-SW112 are connected to one another. The input terminals (3) of the switches SW109-SW112 are connected to one another. The input terminals (4) of the switches SW109-SW112 are connected to one another.

The switches SW101-SW120 and the switch control circuit 72 constitute a reference charge quantity interchange section.

In the color illuminance sensor device, the switches SW101-SW104 and SW113-SW120 operate during the analog to digital conversion period under control of the switch control circuit 72 as in the analog to digital conversion device of the third embodiment.

In the color illuminance sensor device having the arrangement shown in FIG. 11, one analog to digital conversion period is divided into quarters, namely, first to fourth periods, during which the switches SW105-SW112 are controlled by the switch control circuit 72 in the following manner.

In the first period, the switch SW105 is switched to (1), the switch SW106 to (2), the switch SW107 to (3), the switch SW108 to (4), the switch SW109 to (1), the switch SW110 to (2), the switch SW111 to (3), and the switch SW112 to (4).

Next, in the second period, the switch SW105 is switched to (2), the switch SW106 to (3), the switch SW107 to (4), the switch SW108 to (1), the switch SW109 to (2), the switch SW110 to (3), the switch SW111 to (4), and the switch SW112 to (1).

Next, in the third period, the switch SW105 is switched to (3), the switch SW106 to (4), the switch SW107 to (1), the switch SW108 to (2), the switch SW109 to (3), the switch SW110 to (4), the switch SW111 to (1), and the switch SW112 to (2).

Next, in the fourth period, the switch SW105 is switched to (4), the switch SW106 to (1), the switch SW107 to (2), the switch SW108 to (3), the switch SW109 to (4), the switch SW110 to (1), the switch SW111 to (2), and the switch SW112 to (3).

In this way, the reference capacitors C41-C44 are interchanged among the analog to digital converters ADC1-ADC4 every quarter of the analog to digital conversion period so that the reference capacitances used in each analog to digital converter can be equalized among these analog to digital converters ADC1-ADC4, resulting in that error in characteristics due to difference in reference capacitance of the reference capacitor C41-C44 among the analog to digital converters ADC1-ADC4 can be eliminated.

In the illuminance sensor device of the sixth embodiment, an error due to difference in reference quantity of electric charge (reference capacitance), which is one of factors of the error in characteristics between the analog to digital converters ADC1-ADC4, can be eliminated, so that an error in operation results can be reduced. As a result, highly accurate measurement of illuminance is achievable.

Seventh Embodiment

Figure 12:
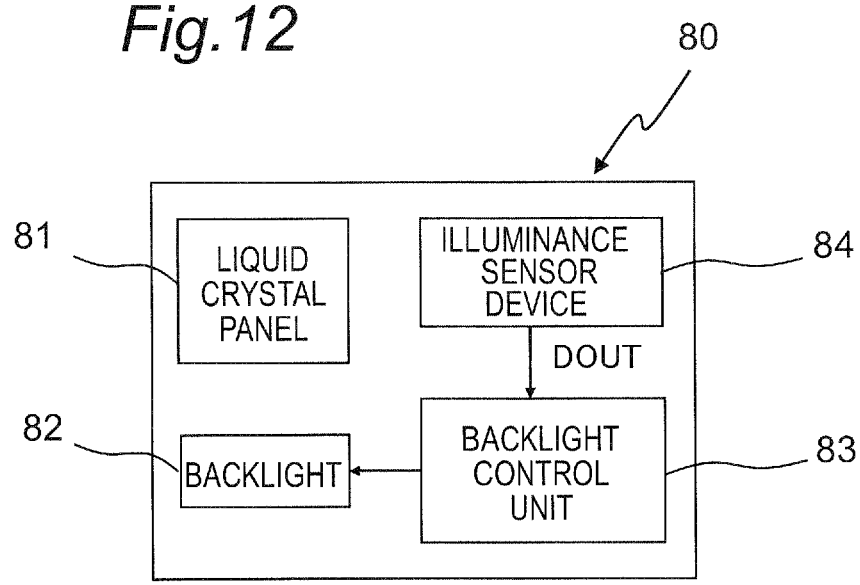
FIG. 12 shows a block diagram of a liquid crystal display device as an example of electronic apparatus according to a seventh embodiment.
Figure 13:
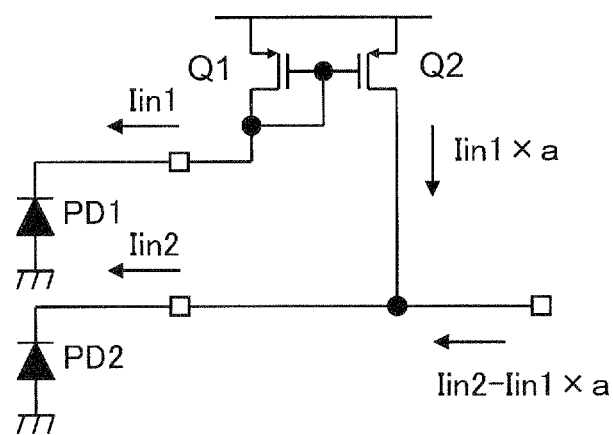
FIG. 13 shows a diagram illustrating a subtractive type configuration using a current mirror circuit according to the first conventional example.
Figure 14:
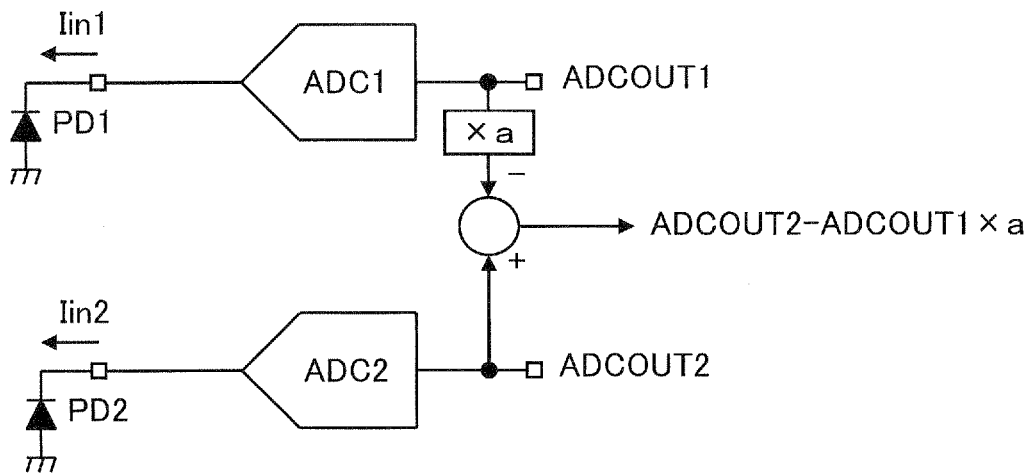
FIG. 14 shows a diagram illustrating an essential part of a configuration according to the second conventional example in which sensor outputs are converted to digital values by analog to digital converters and subtraction between the digital values is performed.
Figure 15:
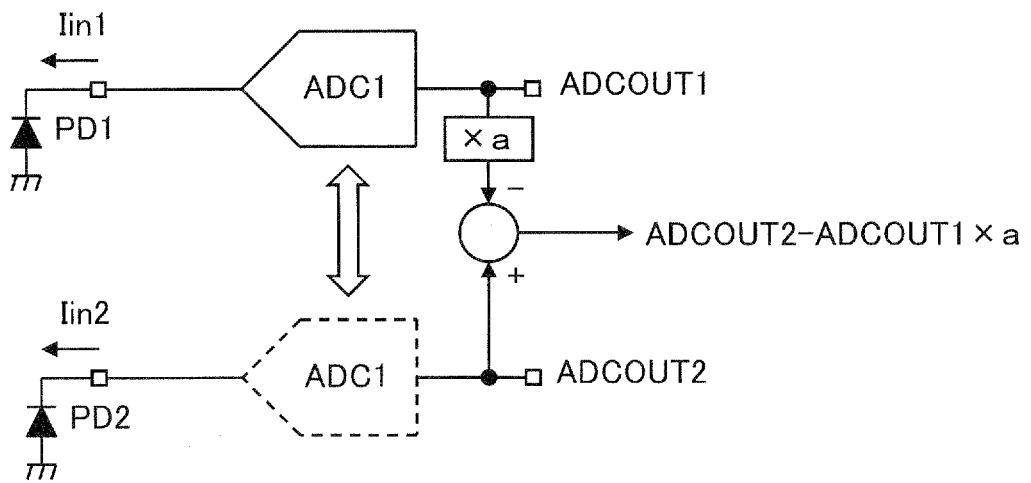
FIG. 15 shows a diagram illustrating an essential part of a configuration according to the third conventional example in which sensor outputs are converted to digital values by a single analog to digital converter and subtraction between the digital values is performed.

FIG. 12 shows a block diagram of a liquid crystal display device as an example of electronic apparatus according to a seventh embodiment.

The liquid crystal display device 80 has, as shown in FIG. 12, a liquid crystal panel 81 for displaying a screen, a backlight device 82 illuminating the liquid crystal panel 81 from its backside, a backlight control unit 83 for controlling luminance of the backlight device 82, and an illuminance sensor device 84. The illuminance sensor devices of FIGS. 4 and 9 or the color illuminance sensor devices FIGS. 4 and 9 or the color illuminance sensor devices of FIGS. 10 and 11 may be used as the illuminance sensor device 84.

The backlight control unit 83 controls the luminance of light from the backlight device 82 based on a DOUT signal, which is a digital signal representing the illuminance, output from the illuminance sensor device 84.

The liquid crystal display device with the above configuration can control the luminance of the backlight device 82 by use of the illuminance sensor device 84 that is able to measure illuminance with high accuracy.

The liquid crystal display device has been described as an example of electronic apparatus in the seventh embodiment, although this is not limitative. The present invention may be applied to other electronic apparatus such as mobile phones and digital still cameras. For example, the present invention can be applied for controlling backlight of a liquid crystal panel of a mobile phone or of a digital still camera.

Embodiments of the invention being thus described, it should be understood that the present invention is not limited to the first to seventh embodiments, but that those embodiments may be varied in many ways within the scope of the invention.

REFERENCE SIGNS LIST 11, 61: reference current source
12, 32, 42, 62, 72: switch control circuit
13: charge circuit
14, 33: discharge circuit
15: comparator circuit
16: D-flip flop
17: counter circuit
18, 35: control circuit
34: SW control circuit
81: liquid crystal panel
82: backlight device
83: backlight control unit
84: illuminance sensor device
ADC1, ADC2, ADC3, ADC4: analog to digital converter
C1: capacitor
C2, C21, C22, C41, C42 C43, C44: reference capacitor
E1, E2, E41, E42, E71, E72, E73, E74: DC voltage source
E3, E4: reference voltage source
F1: red filter
F2: green filter
F3: blue filter
PD1, PD2, PD3, PD4: photodiode
SW1-SW4, SW21, SW22, SW41-SW44, SW90-SW99, SW101-SW120: switch

The invention claimed is:

1. An analog to digital conversion device comprising:
a plurality of analog to digital converters; and
a reference charge quantity interchange section arranged and configured to interchange among the plurality of analog to digital converters reference quantities of electric charge to be used therein during an analog to digital conversion period,
wherein the analog to digital converters consist of n analog to digital converters, where n is an integer of two or more,
the analog to digital conversion device comprising a reference current source to supply each of the n analog to digital converters with n reference currents used as the reference quantities of electric charge, wherein the reference charge quantity interchange section interchanges the reference currents among the n analog to digital converters every one-nth (1/n) of the analog to digital conversion period such that each of the n analog to digital converters uses the n reference currents by time-division scheme.

2. An analog to digital conversion device comprising:
a plurality of analog to digital converters; and
a reference charge quantity interchange section arranged and configured to interchange among the plurality of analog to digital converters reference quantities of electric charge to be used therein during an analog to digital conversion period,
wherein the analog to digital converters consist of n analog to digital converters, where n is an integer of two or more,
the analog to digital conversion device comprising n reference capacitors providing each of the n analog to digital converters with reference capacitances used as the reference quantities of electric charge, wherein the reference charge quantity interchange section interchanges the reference capacitors among the n analog to digital converters every one-nth (1/n) of the analog to digital conversion period such that each of the n analog to digital converters uses the reference capacitances of the n reference capacitors by time-division scheme.

3. An analog to digital conversion device comprising:
a plurality of analog to digital converters; and
a reference charge quantity interchange section arranged and configured to interchange among the plurality of analog to digital converters reference quantities of electric charge to be used therein during an analog to digital conversion period,
wherein each analog to digital converter comprises:
a charge circuit having a capacitor for storing electric charge corresponding to an input current to the analog to digital converter;
a discharge circuit configured to discharge the electric charge stored in the capacitor of the charge circuit;
a reference voltage source configured to supply a reference voltage;
a comparator configured to compare an output voltage output from the charge circuit with the reference voltage output from the reference voltage source;
a switch configured to connect an output of the reference voltage source to an output of the charge circuit to charge the output of the charge circuit up to the reference voltage; and
a control circuit controlling the discharge circuit, the control circuit being configured to count a number of discharges by the discharge circuit, based on outputs of the comparator, and output a digital value corresponding to the number of discharges.

4. An illuminance sensor device comprising:
the analog to digital conversion device according to claim 1;
a first photodiode having spectral characteristics of an infrared region; and
a second photodiode having spectral characteristics of from a visible to an infrared region,
wherein the analog to digital conversion device has two analog to digital converters, one of which is supplied with an input current from the first photodiode and the other of which is supplied with an input current from the second photodiode.

5. An illuminance sensor device comprising:
the analog to digital conversion device according to claim 1;
a first photodiode provided with a filter transmitting light in a red region;
a second photodiode provided with a filter transmitting light in a green region;
a third photodiode provided with a filter transmitting light in a blue region; and
a fourth photodiode having spectral characteristics of from a visible to an infrared region,
the analog to digital conversion device having four analog to digital converters, which are first to fourth analog to digital converters, wherein
the first analog to digital converter is supplied with an input current from the first photodiode,
the second analog to digital converter is supplied with an input current from the second photodiode,
the third analog to digital converter being supplied with an input current from the third photodiode, and
the fourth analog to digital converter being supplied with an input current from the fourth photodiode.

6. Electronic apparatus comprising:
a liquid crystal panel configured to display a screen;
a backlight device configured to illuminate the liquid crystal panel;
a backlight control unit configured to control luminance of light of the backlight device; and
the illuminance sensor device according to claim 4,
the backlight control unit controlling the luminance of light of the backlight device based on digital signals output from the analog to digital converters of the illuminance sensor device.

7. The illuminance sensor device according to claim 4, wherein the analog to digital converters of the analog to digital conversion device consist of n analog to digital converters, where n is an integer of two or more, and
the analog to digital conversion device comprises a reference current source to supply each of the n analog to digital converters with n reference currents used as the reference quantities of electric charge, wherein the reference charge quantity interchange section interchanges the reference currents among the n analog to digital converters every one-nth (1/n) of the analog to digital conversion period such that each of the n analog to digital converters uses the n reference currents by time-division scheme.

8. The illuminance sensor device according to claim 4, wherein the analog to digital converters of the analog to digital conversion device consist of n analog to digital converters, where n is an integer of two or more, and
the analog to digital conversion device comprises n reference capacitors providing each of the n analog to digital converters with reference capacitances used as the reference quantities of electric charge, wherein the reference charge quantity interchange section interchanges the reference capacitors among the n analog to digital converters every one-nth (1/n) of the analog to digital conversion period such that each of the n analog to digital converters uses the reference capacitances of the n reference capacitors by time-division scheme.

9. The illuminance sensor device according to claim 4, wherein each analog to digital converter of the analog to digital conversion device comprises:

a charge circuit having a capacitor for storing electric charge corresponding to an input current to the analog to digital converter;
a discharge circuit configured to discharge the electric charge stored in the capacitor of the charge circuit;
a reference voltage source configured to supply a reference voltage;
a comparator configured to compare an output voltage output from the charge circuit with the reference voltage output from the reference voltage source;
a switch configured to connect an output of the reference voltage source to an output of the charge circuit to charge the output of the charge circuit up to the reference voltage; and
a control circuit controlling the discharge circuit, the control circuit being configured to count a number of discharges by the discharge circuit, based on outputs of the comparator, and output a digital value corresponding to the number of discharges.

10. The illuminance sensor device according to claim 5, wherein the analog to digital converters of the analog to digital conversion device consist of n analog to digital converters, where n is an integer of two or more, and
the analog to digital conversion device comprises a reference current source to supply each of the n analog to digital converters with n reference currents used as the reference quantities of electric charge, wherein the reference charge quantity interchange section interchanges the reference currents among the n analog to digital converters every one-nth (1/n) of the analog to digital conversion period such that each of the n analog to digital converters uses the n reference currents by time-division scheme.

11. The illuminance sensor device according to claim 5, wherein the analog to digital converters of the analog to digital conversion device consist of n analog to digital converters, where n is an integer of two or more, and
the analog to digital conversion device comprises n reference capacitors providing each of the n analog to digital converters with reference capacitances used as the reference quantities of electric charge, wherein the reference charge quantity interchange section interchanges the reference capacitors among the n analog to digital converters every one-nth (I/n) of the analog to digital conversion period such that each of the n analog to digital converters uses the reference capacitances of the n reference capacitors by time-division scheme.

12. The illuminance sensor device according to claim 5, wherein each analog to digital converter of the analog to digital conversion device comprises:
a charge circuit having a capacitor for storing electric charge corresponding to an input current to the analog to digital converter;
a discharge circuit configured to discharge the electric charge stored in the capacitor of the charge circuit;
a reference voltage source configured to supply a reference voltage;
a comparator configured to compare an output voltage output from the charge circuit with the reference voltage output from the reference voltage source;
a switch configured to connect an output of the reference voltage source to an output of the charge circuit to charge the output of the charge circuit up to the reference voltage; and
a control circuit controlling the discharge circuit, the control circuit being configured to count a number of discharges by the discharge circuit, based on outputs of the comparator, and output a digital value corresponding to the number of discharges.

13. Electronic apparatus comprising:
a liquid crystal panel configured to display a screen;
a backlight device configured to illuminate the liquid crystal panel;
a backlight control unit configured to control luminance of light of the backlight device; and
the illuminance sensor device according to claim 5,
the backlight control unit controlling the luminance of light of the backlight device based on digital signals output from the analog to digital converters of the illuminance sensor device.

14. An illuminance sensor device comprising:
the analog to digital conversion device according to claim 2;
a first photodiode having spectral characteristics of an infrared region; and
a second photodiode having spectral characteristics of from a visible to an infrared region,
wherein the analog to digital conversion device has two analog to digital converters, one of which is supplied with an input current from the first photodiode and the other of which is supplied with an input current from the second photodiode.

15. An illuminance sensor device comprising:
the analog to digital conversion device according to claim 2;
a first photodiode provided with a filter transmitting light in a red region;
a second photodiode provided with a filter transmitting light in a green region;
a third photodiode provided with a filter transmitting light in a blue region; and
a fourth photodiode having spectral characteristics of from a visible to an infrared region,
the analog to digital conversion device having four analog to digital converters, which are first to fourth analog to digital converters, wherein
the first analog to digital converter is supplied with an input current from the first photodiode,
the second analog to digital converter is supplied with an input current from the second photodiode,
the third analog to digital converter being supplied with an input current from the third photodiode, and
the fourth analog to digital converter being supplied with an input current from the fourth photodiode.

16. Electronic apparatus comprising:
a liquid crystal panel configured to display a screen;
a backlight device configured to illuminate the liquid crystal panel;
a backlight control unit configured to control luminance of light of the backlight device; and
the illuminance sensor device according to claim 14,
the backlight control unit controlling the luminance of light of the backlight device based on digital signals output from the analog to digital converters of the illuminance sensor device.

17. The illuminance sensor device according to claim 14, wherein the analog to digital converters of the analog to digital conversion device consist of n analog to digital converters, where n is an integer of two or more, and
the analog to digital conversion device comprises a reference current source to supply each of the n analog to digital converters with n reference currents used as the reference quantities of electric charge, wherein the reference charge quantity interchange section interchanges the reference currents among the n analog to digital converters every one-nth (1/n) of the analog to digital conversion period such that each of the n analog to digital converters uses the n reference currents by time-division scheme.

18. The illuminance sensor device according to claim 14, wherein the analog to digital converters of the analog to digital conversion device consist of n analog to digital converters, where n is an integer of two or more, and
the analog to digital conversion device comprises n reference capacitors providing each of the n analog to digital converters with reference capacitances used as the reference quantities of electric charge, wherein the reference charge quantity interchange section interchanges the reference capacitors among the n analog to digital converters every one-nth (1/n) of the analog to digital conversion period such that each of the n analog to digital converters uses the reference capacitances of the n reference capacitors by time-division scheme.

19. The illuminance sensor device according to claim 14, wherein each analog to digital converter of the analog to digital conversion device comprises:
a charge circuit having a capacitor for storing electric charge corresponding to an input current to the analog to digital converter,
a discharge circuit configured to discharge the electric charge stored in the capacitor of the charge circuit;
a reference voltage source configured to supply a reference voltage;
a comparator configured to compare an output voltage output from the charge circuit with the reference voltage output from the reference voltage source;
a switch configured to connect an output of the reference voltage source to an output of the charge circuit to charge the output of the charge circuit up to the reference voltage; and
a control circuit controlling the discharge circuit, the control circuit being configured to count a number of discharges by the discharge circuit, based on outputs of the comparator, and output a digital value corresponding to the number of discharges.

20. The illuminance sensor device according to claim 15, wherein the analog to digital converters of the analog to digital conversion device consist of n analog to digital converters, where n is an integer of two or more, and
the analog to digital conversion device comprises a reference current source to supply each of the n analog to digital converters with n reference currents used as the reference quantities of electric charge, wherein the reference charge quantity interchange section interchanges the reference currents among the n analog to digital converters every one-nth (1/n) of the analog to digital conversion period such that each of the n analog to digital converters uses the n reference currents by time-division scheme.

21. The illuminance sensor device according to claim 15, wherein the analog to digital converters of the analog to digital conversion device consist of n analog to digital converters, where n is an integer of two or more, and
the analog to digital conversion device comprises n reference capacitors providing each of the n analog to digital converters with reference capacitances used as the reference quantities of electric charge, wherein the reference charge quantity interchange section interchanges the reference capacitors among the n analog to digital converters every one-nth (1/n) of the analog to digital conversion period such that each of the n analog to digital converters uses the reference capacitances of the n reference capacitors by time-division scheme.

22. The illuminance sensor device according to claim 15, wherein each analog to digital converter of the analog to digital conversion device comprises:
a charge circuit having a capacitor for storing electric charge corresponding to an input current to the analog to digital converter,
a discharge circuit configured to discharge the electric charge stored in the capacitor of the charge circuit;
a reference voltage source configured to supply a reference voltage;
a comparator configured to compare an output voltage output from the charge circuit with the reference voltage output from the reference voltage source;
a switch configured to connect an output of the reference voltage source to an output of the charge circuit to charge the output of the charge circuit up to the reference voltage; and
a control circuit controlling the discharge circuit, the control circuit being configured to count a number of discharges by the discharge circuit, based on outputs of the comparator, and output a digital value corresponding to the number of discharges.

23. Electronic apparatus comprising:
a liquid crystal panel configured to display a screen;
a backlight device configured to illuminate the liquid crystal panel;
a backlight control unit configured to control luminance of light of the backlight device; and
the illuminance sensor device according to claim 15,
the backlight control unit controlling the luminance of light of the backlight device based on digital signals output from the analog to digital converters of the illuminance sensor device.

24. An illuminance sensor device comprising:
the analog to digital conversion device according to claim 3,
a first photodiode having spectral characteristics of an infrared region; and
a second photodiode having spectral characteristics of from a visible to an infrared region,
wherein the analog to digital conversion device has two analog to digital converters, one of which is supplied with an input current from the first photodiode and the other of which is supplied with an input current from the second photodiode.

25. An illuminance sensor device comprising:
the analog to digital conversion device according to claim 3,
a first photodiode provided with a filter transmitting light in a red region;
a second photodiode provided with a filter transmitting light in a green region;
a third photodiode provided with a filter transmitting light in a blue region; and
a fourth photodiode having spectral characteristics of from a visible to an infrared region,
the analog to digital conversion device having four analog to digital converters, which are first to fourth analog to digital converters, wherein
the first analog to digital converter is supplied with an input current from the first photodiode,
the second analog to digital converter is supplied with an input current from the second photodiode,
the third analog to digital converter being supplied with an input current from the third photodiode, and
the fourth analog to digital converter being supplied with an input current from the fourth photodiode.

26. Electronic apparatus comprising:
a liquid crystal panel configured to display a screen;
a backlight device configured to illuminate the liquid crystal panel;
a backlight control unit configured to control luminance of light of the backlight device; and
the illuminance sensor device according to claim 24,
the backlight control unit controlling the luminance of light of the backlight device based on digital signals output from the analog to digital converters of the illuminance sensor device.

27. The illuminance sensor device according to claim 24, wherein the analog to digital converters of the analog to digital conversion device consist of n analog to digital converters, where n is an integer of two or more, and
the analog to digital conversion device comprises a reference current source to supply each of the n analog to digital converters with n reference currents used as the reference quantities of electric charge, wherein the reference charge quantity interchange section interchanges the reference currents among the n analog to digital converters every one-nth (1/n) of the analog to digital conversion period such that each of the n analog to digital converters uses the n reference currents by time-division scheme.

28. The illuminance sensor device according to claim 24, wherein the analog to digital converters of the analog to digital conversion device consist of n analog to digital converters, where n is an integer of two or more, and
the analog to digital conversion device comprises n reference capacitors providing each of the n analog to digital converters with reference capacitances used as the reference quantities of electric charge, wherein the reference charge quantity interchange section interchanges the reference capacitors among the n analog to digital converters every one-nth (1/n) of the analog to digital conversion period such that each of the n analog to digital converters uses the reference capacitances of the n reference capacitors by time-division scheme.

29. The illuminance sensor device according to claim 24, wherein each analog to digital converter of the analog to digital conversion device comprises:
a charge circuit having a capacitor for storing electric charge corresponding to an input current to the analog to digital converter,
a discharge circuit configured to discharge the electric charge stored in the capacitor of the charge circuit;
a reference voltage source configured to supply a reference voltage;
a comparator configured to compare an output voltage output from the charge circuit with the reference voltage output from the reference voltage source;
a switch configured to connect an output of the reference voltage source to an output of the charge circuit to charge the output of the charge circuit up to the reference voltage; and
a control circuit controlling the discharge circuit, the control circuit being configured to count a number of discharges by the discharge circuit, based on outputs of the comparator, and output a digital value corresponding to the number of discharges.

30. The illuminance sensor device according to claim 25, wherein the analog to digital converters of the analog to digital conversion device consist of n analog to digital converters, where n is an integer of two or more, and the analog to digital conversion device comprises a reference current source to supply each of the n analog to digital converters with n reference currents used as the reference quantities of electric charge, wherein the reference charge quantity interchange section interchanges the reference currents among the n analog to digital converters every one-nth (1/n) of the analog to digital conversion period such that each of the n analog to digital converters uses the n reference currents by time-division scheme.

31. The illuminance sensor device according to claim 25, wherein the analog to digital converters of the analog to digital conversion device consist of n analog to digital converters, where n is an integer of two or more, and the analog to digital conversion device comprises n reference capacitors providing each of the n analog to digital converters with reference capacitances used as the reference quantities of electric charge, wherein the reference charge quantity interchange section interchanges the reference capacitors among the n analog to digital converters every one-nth (1/n) of the analog to digital conversion period such that each of the n analog to digital converters uses the reference capacitances of the n reference capacitors by time-division scheme.

32. The illuminance sensor device according to claim 25, wherein each analog to digital converter of the analog to digital conversion device comprises:

a charge circuit having a capacitor for storing electric charge corresponding to an input current to the analog to digital converter, a discharge circuit configured to discharge the electric charge stored in the capacitor of the charge circuit;

a reference voltage source configured to supply a reference voltage;

a comparator configured to compare an output voltage output from the charge circuit with the reference voltage output from the reference voltage source;

a switch configured to connect an output of the reference voltage source to an output of the charge circuit to charge the output of the charge circuit up to the reference voltage; and a control circuit controlling the discharge circuit, the control circuit being configured to count a number of discharges by the discharge circuit, based on outputs of the comparator, and output a digital value corresponding to the number of discharges.

33. Electronic apparatus comprising:

a liquid crystal panel configured to display a screen;

a backlight device configured to illuminate the liquid crystal panel;

a backlight control unit configured to control luminance of light of the backlight device; and the illuminance sensor device according to claim 25, the backlight control unit controlling the luminance of light of the backlight device based on digital signals output from the analog to digital converters of the illuminance sensor device.

* * * * *